United States Patent
Yamamoto et al.

(10) Patent No.: US 7,330,043 B2
(45) Date of Patent: Feb. 12, 2008

(54) SEMICONDUCTOR DEVICE AND TEST METHOD FOR THE SAME

(75) Inventors: Seiji Yamamoto, Kasugai (JP); Hirosuke Koumyoji, Kasugai (JP); Tohru Yasuda, Kasugai (JP); Mikio Ishikawa, Kasugai (JP); Isaya Sobue, Kasugai (JP); Hajime Sato, Kasugai (JP); Chiaki Furukawa, Kasugai (JP); Akira Sugiura, Kasugai (JP); Akihiro Iwase, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/079,142

(22) Filed: Mar. 15, 2005

(65) Prior Publication Data

US 2005/0156589 A1 Jul. 21, 2005

Related U.S. Application Data

(62) Division of application No. 10/356,489, filed on Feb. 3, 2003, now Pat. No. 6,885,212.

(30) Foreign Application Priority Data

Jun. 25, 2002 (JP) ............................. 2002-184340
Jul. 15, 2002 (JP) ............................. 2002-205270

(51) Int. Cl.
*G01R 31/26* (2006.01)
*G01R 31/28* (2006.01)

(52) U.S. Cl. .................................. 324/765; 324/158.1

(58) Field of Classification Search ................ 324/523, 324/754, 760, 763, 765, 158.1; 438/14–18; 327/564–566
See application file for complete search history.

(56) References Cited

U.S. PATENT DOCUMENTS

| 5,053,700 | A | * | 10/1991 | Parrish ........................ 324/537 |
| 5,059,899 | A | * | 10/1991 | Farnworth et al. ......... 324/73.1 |
| 5,581,432 | A |   | 12/1996 | Wellnitz et al. |
| 5,760,643 | A |   | 6/1998 | Whetsel |
| 6,163,867 | A |   | 12/2000 | Miller et al. |

(Continued)

FOREIGN PATENT DOCUMENTS

JP S56-87874 7/1981

(Continued)

*Primary Examiner*—Jermele Hollington
(74) *Attorney, Agent, or Firm*—Arent Fox LLP

(57) ABSTRACT

A multi-bus semiconductor device and a method of its probing test perform the DC test for individual pads of a device while dealing with an adequate number of devices for simultaneous measurement based on the scheme of input/output pad number compressive test. The semiconductor device includes switch elements SW0-SW4 connected between input/output pads P0-P4 and a testing line L0 so that pads in an arbitrary combination, among the off-probe pads P1-P4 that are not made in contact with the tester probe Pr0, are selected for testing in correspondence to the combination of switch elements that are turned on. The input/output buffers of the pads under test are deactivated to block their internal current paths. The corresponding switch elements are turned on to connect the off-probe pads under test to the probe pad P0 that is made in contact with the tester probe Pr0, and the leak current of the probes is measured with the tester TS.

14 Claims, 20 Drawing Sheets

U.S. PATENT DOCUMENTS

| | | |
|---|---|---|
| 6,326,801 B1 | 12/2001 | Whetsel |
| 6,586,266 B1 | 7/2003 | Lin |
| 6,621,285 B1 | 9/2003 | Yatsu |
| 6,622,289 B2 * | 9/2003 | Saunders et al. ........... 324/754 |
| 6,727,722 B2 | 4/2004 | Whetsel |
| 6,885,212 B2 * | 4/2005 | Yamamoto et al. ......... 324/765 |

FOREIGN PATENT DOCUMENTS

| | | |
|---|---|---|
| JP | H02-183551 | 7/1990 |
| JP | 10-003800 | 1/1998 |
| JP | H10-003800 | 6/1998 |
| JP | 11-016391 | 1/1999 |
| JP | H11-016391 | 1/1999 |
| JP | 2000-208569 | 7/2000 |
| JP | 2001-014892 | 1/2001 |

* cited by examiner

OPERATIONAL FLOWCHART OF FIRST EMBODIMENT

OPERATIONAL FLOWCHART OF FIRST VARIANT OF FIRST EMBODIMENT (EXCLUSIVE CONNECTION)

OPERATIONAL FLOWCHART OF SECOND VARIANT OF FIRST EMBODIMENT (MULTIPLE CONNECTION)

FIG. 5 SCHEMATIC BLOCK DIAGRAM OF THIRD VARIANT OF FIRST EMBODIMENT

SCHEMATIC BLOCK DIAGRAM OF FOURTH VARIANT OF FIRST EMBODIMENT

FIG. 7 SCHEMATIC BLOCK DIAGRAM OF SECOND EMBODIMENT

OPERATIONAL FLOWCHART OF SECOND VARIANT OF SECOND EMBODIMENT

FIG.10 SCHEMATIC BLOCK DIAGRAM OF THIRD EMBODIMENT

FIG.11 SCHEMATIC CIRCUIT DIAGRAM OF LEVEL SHIFTER IN FIG.10

FIG.12 SCHEMATIC BLOCK DIAGRAM OF FOURTH EMBODIMENT

OPERATIONAL FLOWCHART OF FOURTH EMBODIMENT

CONCEPTUAL DIAGRAM OF FIFTH EMBODIMENT

SCHEMATIC CIRCUIT DIAGRAM OF FIRST VARIANT OF FIFTH EMBODIMENT

SCHEMATIC CIRCUIT DIAGRAM OF SWITCH ELEMENT

SCHEMATIC CIRCUIT DIAGRAM OF SECOND VARIANT OF FIFTH EMBODIMENT

SCHEMATIC CIRCUIT DIAGRAM OF THIRD VARIANT OF FIFTH EMBODIMENT

SCHEMATIC CIRCUIT DIAGRAM OF FOURTH VARIANT OF FIFTH EMBODIMENT

SCHEMATIC CIRCUIT DIAGRAM OF FIFTH VARIANT OF FIFTH EMBODIMENT

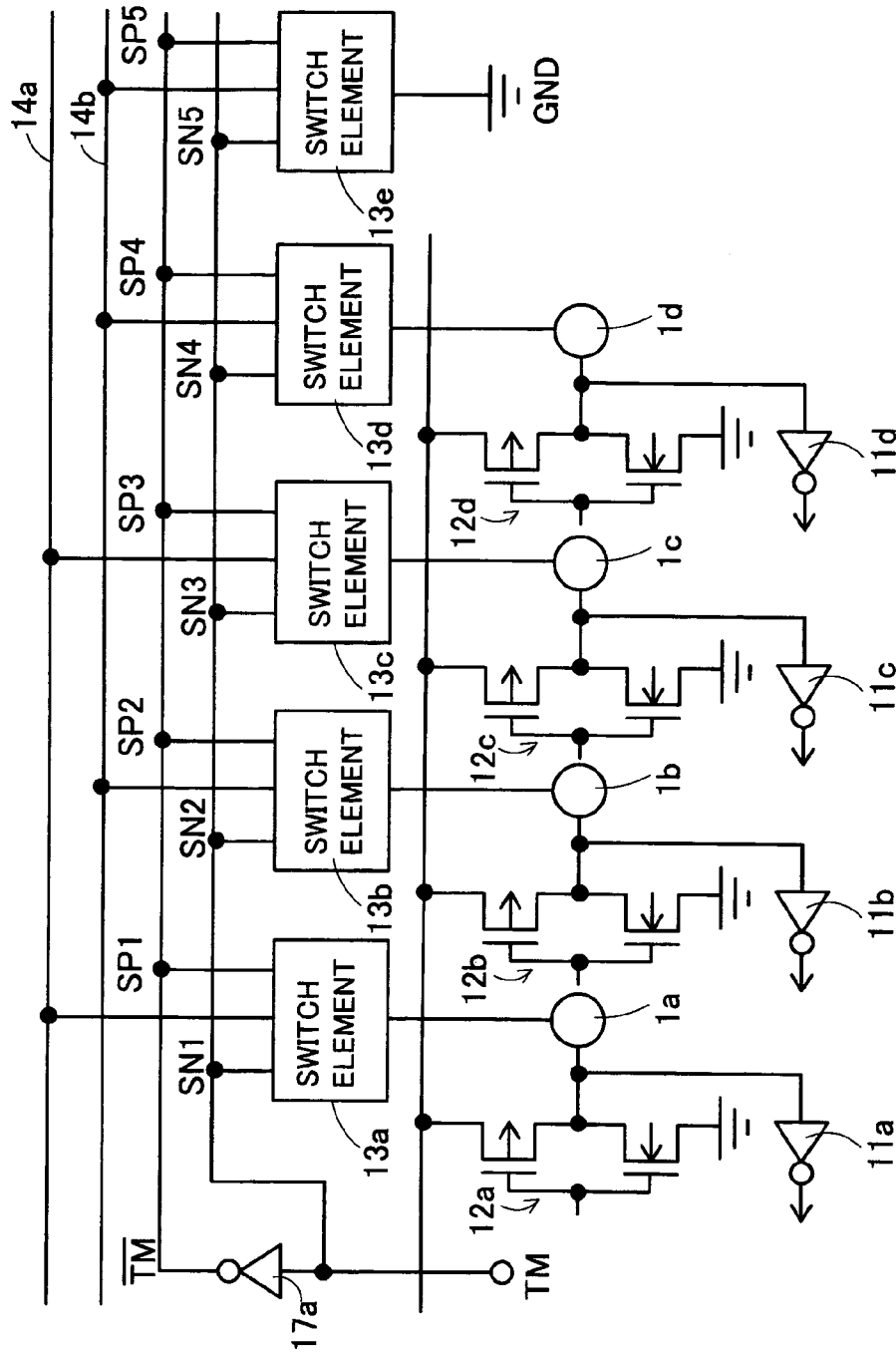
FIG.21 SCHEMATIC CIRCUIT DIAGRAM OF SIXTH VARIANT OF FIFTH EMBODIMENT

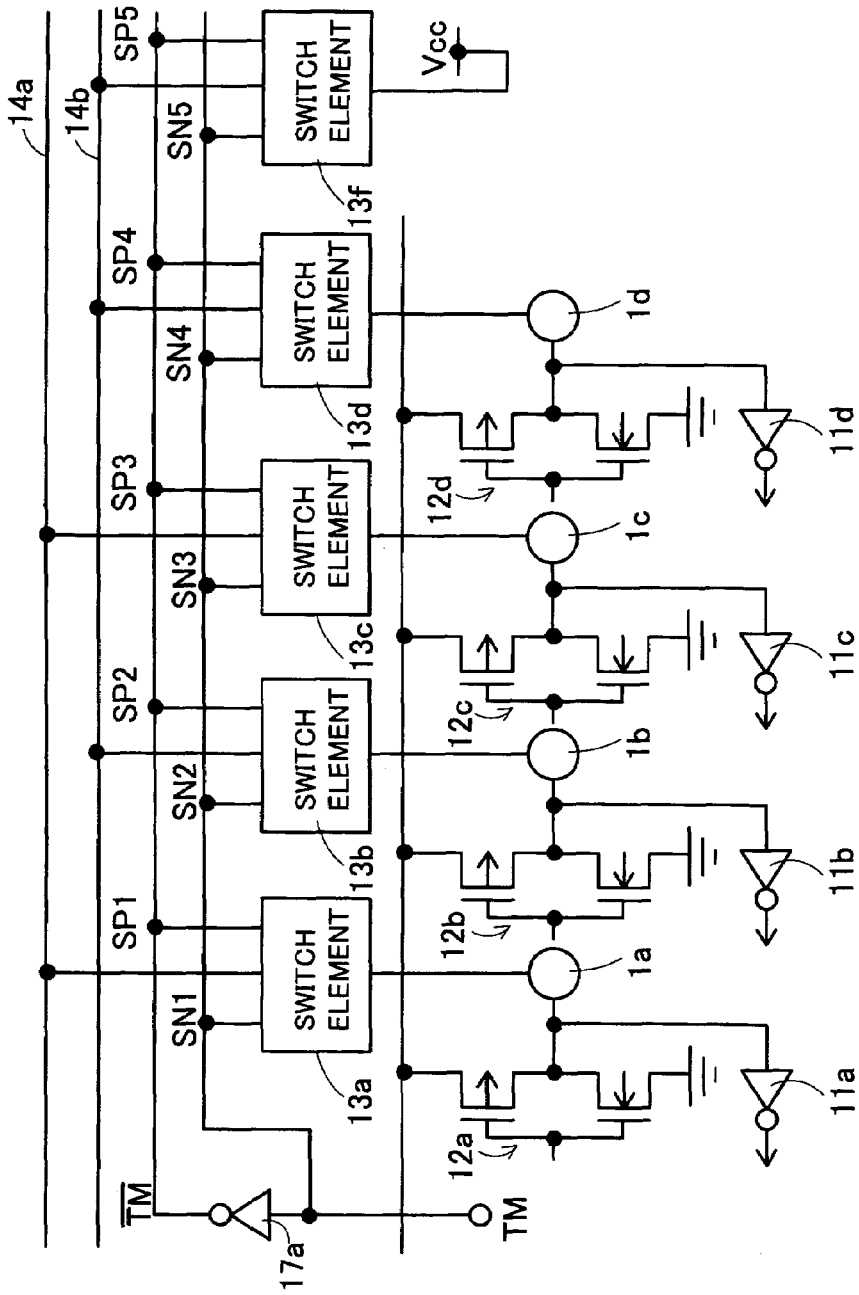
FIG.22 SCHEMATIC CIRCUIT DIAGRAM OF SEVENTH VARIANT OF FIFTH EMBODIMENT

SEMICONDUCTOR DEVICE AND TEST METHOD FOR THE SAME

CROSS-REFERENCE TO RELATED APPLICATION

This application is a divisional application which claims the benefit of application Ser. No. 10/356,489, filed Feb. 3, 2003 now U.S. Pat. No. 6,885,212. The disclosure of the prior application is hereby incorporated herein by reference in its entirety.

BACKGROUND OF THE INVENTION

1. Field of the Invention

The present invention relates to the testing of semiconductor devices having multiple input/output pads, and particularly to the testing on individual input/output pads of semiconductor devices based on the probing by the tester on one pad out of a certain number of pads.

2. Description of the Prior Art

As a recent advanced semiconductor device fabrication technique, a number of semiconductor devices are packaged in a plastic case to complete a high-performance LSI. High-performance is represented by SIP (System In Package) in which LSIs of different kinds such as the system or microprocessor and memory devices are packaged in a case, and MCP (Multi-Chip Package) in which LSIs of a same kind such as memory devices are packaged in a case.

Individual semiconductor devices in a SIP or MCP have some of their input/output pads led out of the case to become input/output pins of the SIP or MCP and have other input/output pads solely interconnected among the devices without being led out of the case. On this account, for testing the operational characteristics of these devices, it is necessary to test the devices while they are on the wafer or before they are packaged in the case of SIP or MCP.

The on-wafer test is conducted by bringing the probes of LSI tester in contact with pads of a device (will be called "probing test"). The probing test is generally conducted for a number of devices simultaneously within the allowance in terms of the number of test signal drivers and response signal comparators in the LSI tester in order to minimize the testing time.

Application systems accomplished by SIPs and MCPs are becoming sophisticated and complex, and these SIPs and MCPs are required to have a large data bus width and thus a large number of input/output pads. Specifically, for example, memory devices which used to have a 16-bit or 32-bit data bus are now required to have a 64-bit or 128-bit data bus, i.e., 64 or 128 input/output pads.

The probing test for a device having such a large number of input/output pads is conducted basically by bringing the tester probes in contact with all pads which align closely on the device. Consequently, a large number of signal drivers and comparators of the tester need to be assigned to one device, resulting in a limited number of devices which can be tested at once.

As a scheme of performing the probing test for devices having a large number of input/output pads while dealing with an adequate number of devices at once, there has been devised a scheme of input/output pad number compressive test as described in Japanese Laid-open Patent Publication No. 10-3800 and Japanese Laid-open Patent Publication No. 11-16391. In the pad number compressive test, each test probe is used for signal transaction with one input/output pad (probe pad) which represents a certain number of pads, instead of signal transaction with all pads. Other pads (off-probe pads) have internal signal routes which are common to the probe pad so that all internal circuits corresponding to the certain number of input/output pads are supplied with a common signal.

Output signals from the internal circuit to all pads, with their logic levels being settled, are conducted to the probe pad as a verification result so that the AC test which verifies the functional characteristics of the device are performed for the certain number of input/output pads. Consequently, the number of test probes to be brought in contact with input/output pads necessary for the probing test of one device is reduced to the reciprocal of the certain number and an adequate number of devices can be treated for simultaneous measurement.

However, the conventional fundamental probing test based on the provision of probes to be brought in contact with all pads will encounter the difficulty of aligning the probes at a microstructured pad interval. Accordingly, this scheme is problematic in that the device can possibly have its pad interval restricted by the limit of probe alignment interval.

Another problem is that even if the tester probes can be brought in contact with all pads of a wide-bus device, a large number of drivers and comparators for the signal transaction with the device through the probes become necessary, resulting in a smaller number of devices which can be treated for the simultaneous probing test and thus an increased testing time and cost due to the degraded efficiency of test.

Still another problem of the conventional probing test based on the pad number compressive test scheme is that a probe is brought in contact with only one input/output pad which represents a certain number of pads, causing the rest of the pads having no direct signal transaction to be excluded from the test for measuring the input/output leak currents (leak current test) and detecting the line breakage (open-line test).

SUMMARY OF THE INVENTION

With the intention of solving at least one of the foregoing prior art problems, a prime object of the present invention is to provide a wide-bus semiconductor device and a method of its probing test, which is based on the above-mentioned scheme of input/output pad number compressive test, which are capable of performing the leak current test and open-line test for individual input/output pads while dealing with an adequate number of devices at once.

In order to achieve the above objective, according to first aspect of the present invention, there is provided a semiconductor device adapted to scheme of input/output pad number compressive test comprising: a probe pad which is either one of input/output pads and made in contact with a tester probe; at least one off-probe pad which is either one of input/output pads not made in contact with the tester probe; and at least one switch element connected between the probe and the off-probe pad, wherein the probe pad and the off-probe pad constitute a common pad group, a test signal is commonly inputted/outputted through the probe pad, and the switch element is activated by a switch control signal which becomes active at time of testing.

In this semiconductor-device, the switch elements provided between the probe pad and at least one off-probe pad of the common pad group for the pad number compressive test are turned on by the switch control signal at time of testing, thereby connecting electrically the off-probe pad to the probe pad.

Based on the conduction between the pads of the common pad group for the pad number compressive test by at least one switch element, it becomes possible to measure the leak current of the off-probe pad through the probe pad. Even in case the tester probe is allowed to be in contact with only the probe pad in the pad number compressive AC test, it is possible to measure the leak current of all input/output pads including the probe pad and off-probe pads.

This semiconductor device enables the leak current measuring test while using the pad number compressive test mode which is effective for the AC test in order to overcome such problems that the pad (input/output pad) interval is restricted by the limit of probe alignment interval of the probing test and that the number of devices of simultaneous probing test is limited due to an increased number of probes.

According to another aspect of the present invention, there is provided a semiconductor device capable of compressing number of input/output pads at time of testing, the semiconductor device comprising:

switch elements which are turned on by a switch control signal which becomes active at the time of testing; and common testing lines connected to the input/output pads, wherein adjacent input/output pads are connected to different common testing lines through the switch elements, or wherein every other input/output pad among the input/output pads in linear alignment is connected to any one of the common testing lines through the switch elements.

This semiconductor device enables the measurement of leak current between adjacent input/output pads, particularly between pads having a diode-characteristic leak current path, by setting a proper bias voltage polarity and voltage difference between the pads.

The semiconductor device test method according to the first aspect of this invention is characterized by operational steps of: deactivating the signal paths between the pads of the common pad group and an internal circuit of the semiconductor device; turning on the switch elements between the probe pad and a pad under test among at least one off-probe pad; and measuring a leak current flowing through the probe pad.

In this semiconductor device test method, the input/output pads of the common pad group are isolated electrically from the internal circuit, the probe pad and a pad under test among at least one off-probe pad are connected by at least one switch element, and the total leak current of the probe pad and the pad under test in connection is measured through the probe pad.

Based on the conduction between the input/output pads of the common pad group by at least one switch element for the pad number compressive test, it becomes possible to measure the leak current of the pad under test through the probe pad. Even in case the tester probe is allowed to be in contact with only the probe pad in the pad number compressive AC test, it is possible to measure the leak current of all input/output pads including the probe pad and the off-probe pad.

This semiconductor device test method enables the leak current measuring test while using the pad number compressive test mode which is effective for the AC test in order to overcome such problems that the pad interval is restricted by the limit of probe alignment interval of the probing test and that the number of devices of simultaneous probing test is limited due to an increased number of probes.

The semiconductor device test method according to second aspect of the present invention is characterized by the operational steps of: turning on the switch element between the probe pad and a pad under test among at least one off-probe pad, activating the input/output buffer of the pad under test, and canceling the state of input/output pad number compressive test; implementing a signal input through the probe pad; and implementing a signal output from the probe pad.

In this semiconductor device test method, at least one switch element is turned on to connect a off-probe pad under test that is a pad under test to the probe pad, the input/output buffer of the pad under test is activated to enable signal input, and the state of pad number compressive test is canceled. In the signal input step, a test signal is put in to the pad under test from the probe pad through the switch element. Thereafter, the input/output buffer of the pad under test is brought to the state which enables the signal output, and in the signal output step, a signal is read out from the pad under test to the probe pad through the switch element.

Based on the establishment of a signal path between the probe pad and the pad under test through the switch element, by which the signal input/output of the input/output buffer of the pad under test can be detected, it becomes possible to inspect through the probe pad the line breakage between the pad under test and the signal input path and signal output path of the input/output buffer. Even in case the tester probe is allowed to be in contact with only the probe pad in the pad number compressive AC test, it is possible to perform the open-line test for all input/output pads including the probe pad and the off-probe pad.

The semiconductor device test method according to a third aspect of this invention is characterized by the operational steps of: turning on the switch element between the probe pad and a pad under test among at least one off-probe pad, and deactivating the input/output buffer of the pad under test; implementing a signal input through the probe pad in state of input/output pad number compressive test; activating the output buffer section of the pad under test, and canceling state of input/output pad number compressive test preparatory to a signal output; and implementing the signal output from the probe pad.

Alternatively, the method is characterized by the operational steps of: implementing a signal input through the probe pad in state of input/output pad number compressive test; turning on the switch element between the probe pad and a pad under test among at least one off-probe pad, activating the output buffer section of the pad under test, and canceling state of input/output pad number compressive test preparatory to a signal output; and implementing the signal output from the probe pad.

In this semiconductor device test method, the test signal is put in in the state of pad number compressive test, and thereafter the pad number compressive test state is canceled and the test signal is put out to all pads of the common pad group. The signal released to the pad under test is read out through the switch element and from the probe pad. Turning on of the switch element can be either before or after the signal input. The input/output buffers are kept deactivated in case the switch element is turned on before the signal input.

Based on the establishment of a signal path from the pad under test to the probe pad through the switch element, by which the signal output of the input/output buffer of the pad under test can be detected, it becomes possible to inspect through the probe pad the line breakage between the pad under test and the signal output path of the input/output buffer. Even in case the tester probe is allowed to be in contact with only the probe pad in the pad number compressive AC test, it is possible to perform the open-line test for all input/output pads including the probe pad and the off-probe pad.

According to fourth aspect of the present invention, there is provided a method of testing a semiconductor device which is adapted to scheme of input/output pad number compressive test in which among input/output pads one probe pad that is made in contact with a tester probe and at least one off-probe pad that is not made in contact with the tester probe are grouped as a common pad group and a test signal is inputted/outputted commonly to/from the pads through the probe pad, the method comprising the operational steps of: implementing a signal input through the probe pad in state of input/output pad number compressive test; canceling state of input/output pad number compressive test; implementing an output of the test signal, which has been inputted at the step of the signal input through the probe pad to a pad under test among at least one off-probe pad; retaining the deactivated state of the input/output buffer of the pad under test for holding the output of the test signal to the pad under test; implementing a signal input through the pad under test; setting state of input/output pad number compressive test; and implementing a signal output from the probe pad.

Based on this scheme, it becomes possible to measure the leak current of the off-probe pad even if the semiconductor device does not have testing lines and switch elements.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 21 is a schematic circuit diagram of a sixth variant of the fifth embodiment; and FIG. 22 is a schematic circuit diagram of a seventh variant of the fifth embodiment.

DETAILED DESCRIPTION OF THE PREFERRED EMBODIMENTS

The inventive semiconductor device and its test method will be explained in detail, specifically as the first through fifth embodiments, with reference to the drawings.

Figure 1:
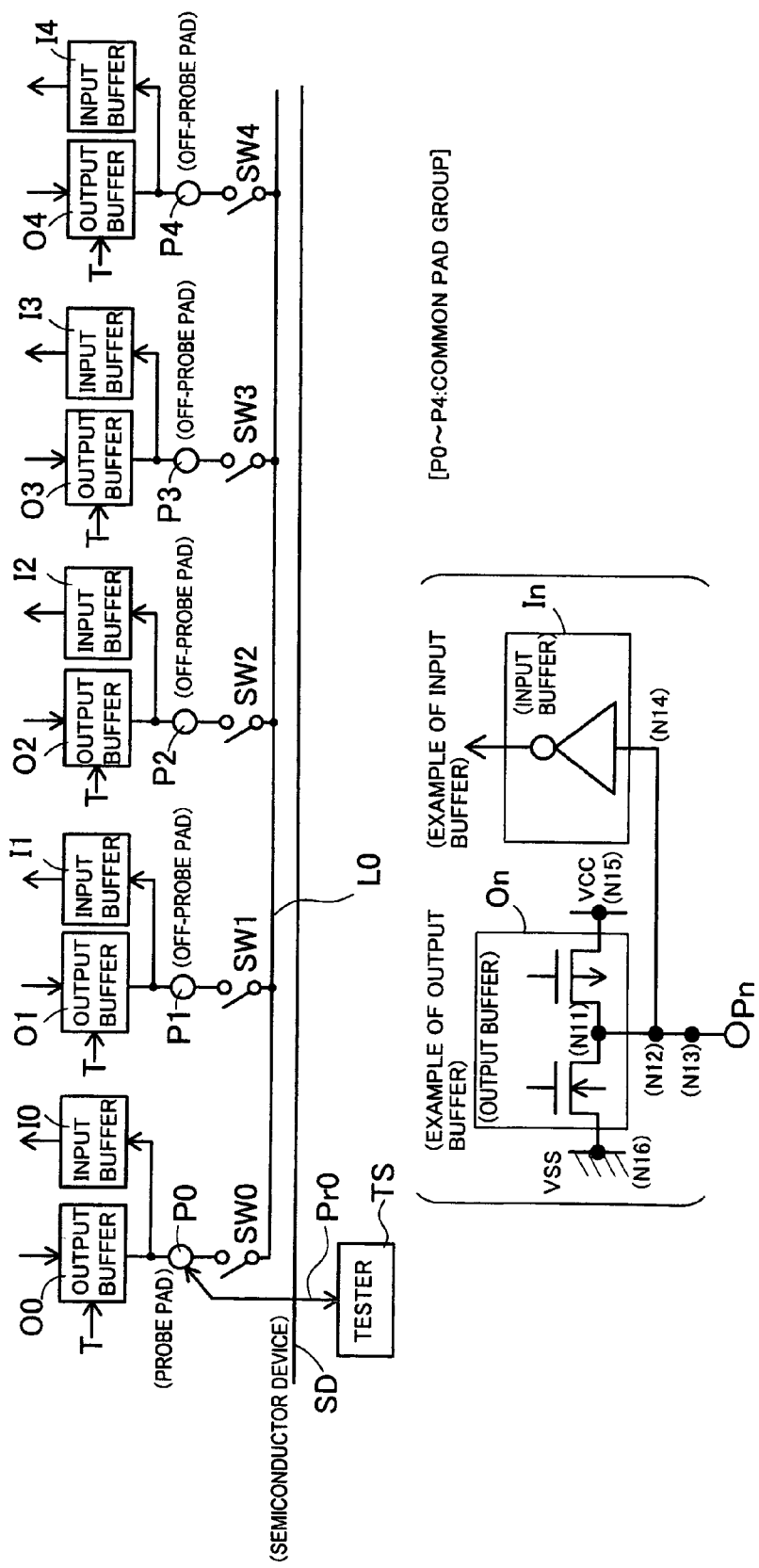
FIG. 1 is a schematic block diagram of a first embodiment of this invention.

FIG. 1 is a block diagram of the first embodiment of this invention, showing a circuit section of semiconductor device including input/output pads P0 through P4 of a common pad group for the input/output pad number compressive test. A tester TS has its probe Pr0 brought in contact with the input/output pad P0 which is designated to be the probe pad. Other input/output pads P1-P4 which are not made in contact with the tester probe Pr0 are off-probe pads. The number of off-probe pads, which is four in this example, can be more or less obviously.

These pads P0-P4 have associated input buffers I0-I4 each arranged to receive an input signal on the gate electrode of MOS transistors and associated output buffers O0-O4 each having a source-drive PMOS transistor and a sink-drive NMOS transistor as shown in the figure. Switch elements SW0-SW4 are connected between the input/output pads P0-P4 and a testing line L0.

The signal line originating from an input/output pad Pn is connected to the input buffer In and output buffer On by a first and second metal layers by way of contacts N12 and N13 between the first and second metal layers. A contact N14 between the metal layer and a poly-silicon layer connects the signal line of metal layer from the pad Pn to the input terminal of poly-silicon layer of the input buffer In. Contacts N15 and N16 and a contact N11 between the metal layer and a diffusion layer connect between the source electrodes of PMOS and NMOS transistors of the output buffer On and the power voltage line VDD and reference voltage line VSS and between their drain electrodes and the input/output pad Pn, respectively.

The output buffers O0-O4 are activated or deactivated in response to the buffer control signal T for the DC test. Otherwise, in case the input buffers I0-I4 are arranged to receive the input signals on the gate electrodes of MOS transistors as shown in FIG. 1, in which case current paths are not formed between the pads P0-P4 and the input buffers I0-I4, the control signal for activating or deactivating the input buffers is not needed. The input buffer control signal is necessary in case the input buffers form current paths to the pads. The input buffer control signal can be substituted by the control signal T in the case of leak current measurement without signal transaction through the input/output buffers. For the open-line test accompanied by signal transaction, the input buffer control signal is preferably separate from the control signal T.

Although FIG. 1 shows the case of controlling all the output buffers O0-O4 by the common control signal T, an alternative conceivable scheme is to provide different control signals for individual output buffers so that these input/ output pads can be tested separately. This affair is applicable equally to the control of input buffers.

Similarly, although not shown in the figure, the switch elements SW0-SW4 for a common pad group can be controlled by a common control signal, or otherwise can be controlled by separate control signals so that the off-probe pads P1-P4 are connected to the probe pad P0 separately for testing. The former control scheme is effective mainly for the leak current test, while the latter control scheme is effective mainly for the open-line test.

Figure 2:
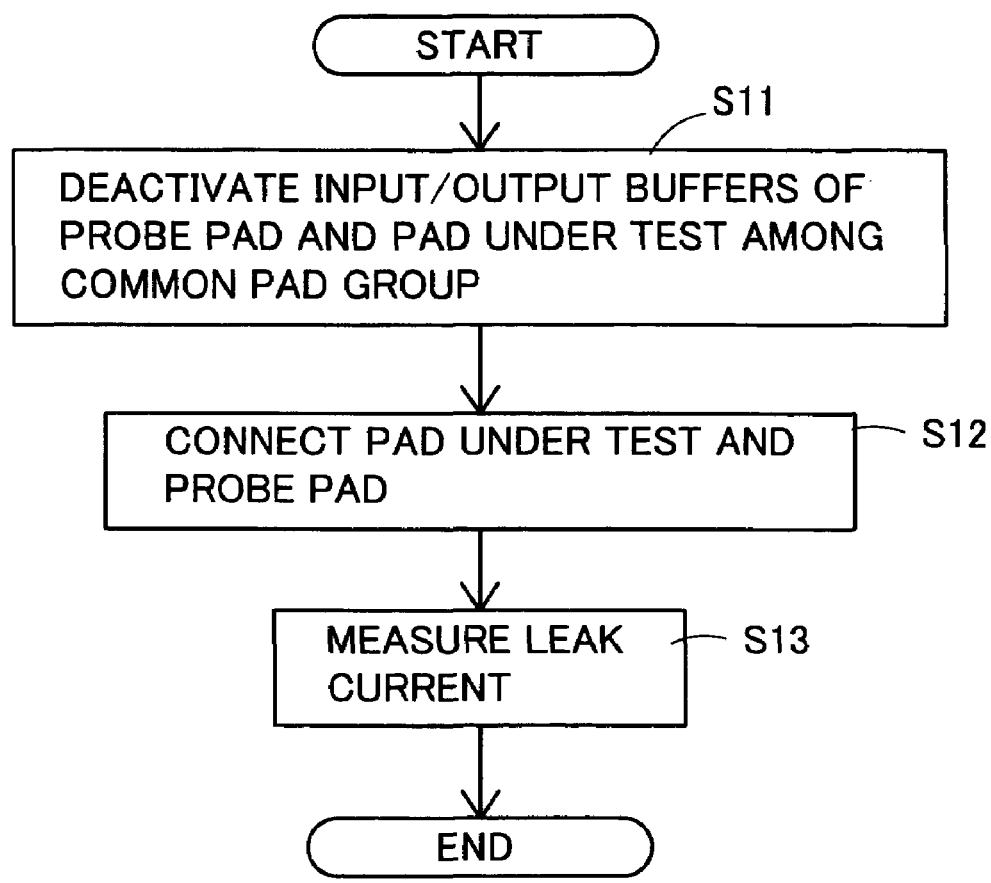
FIG. 2 is an operational flowchart of the first embodiment.
Figure 3:
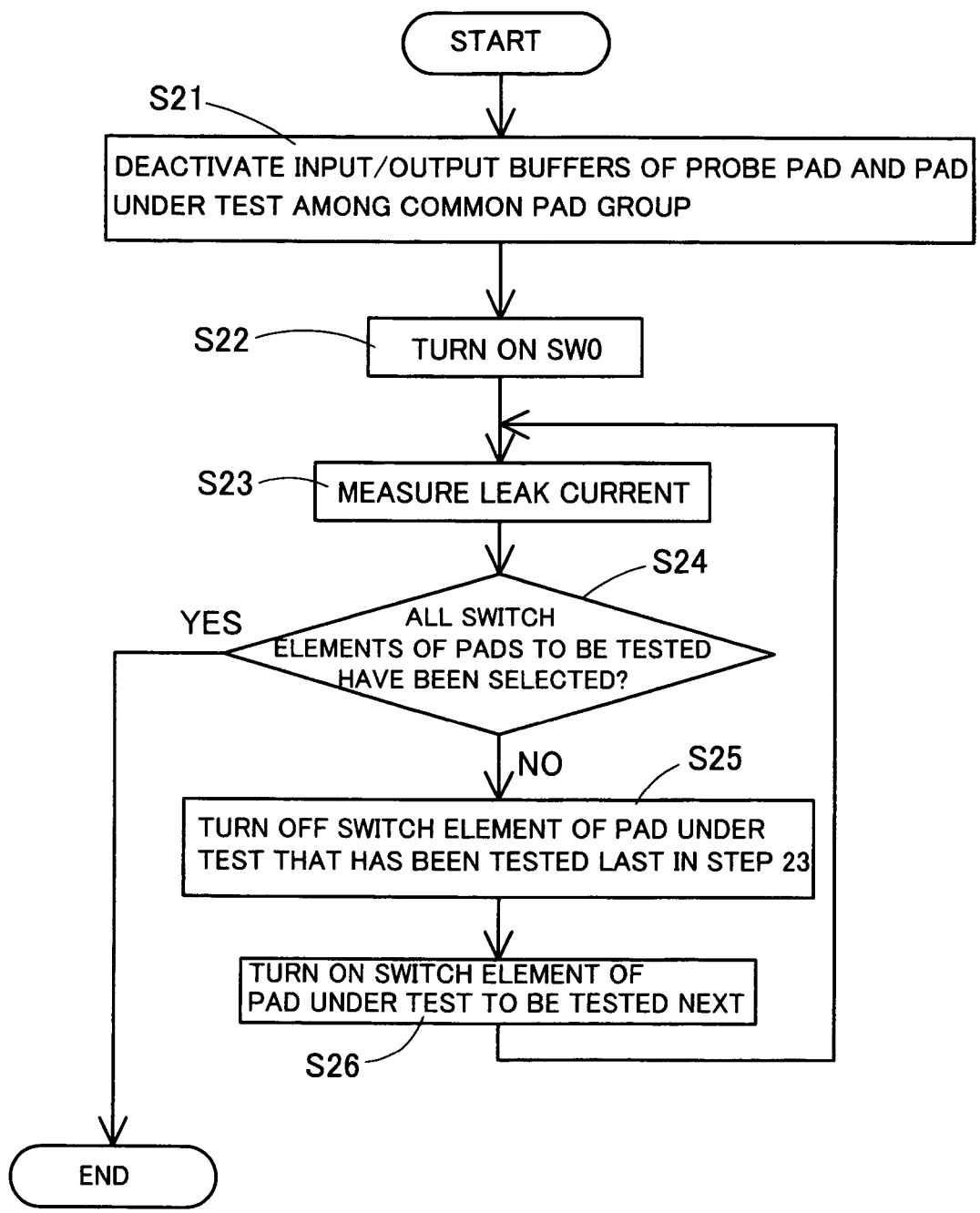
FIG. 3 is an operational flowchart of a first variant of the first embodiment.
Figure 4:
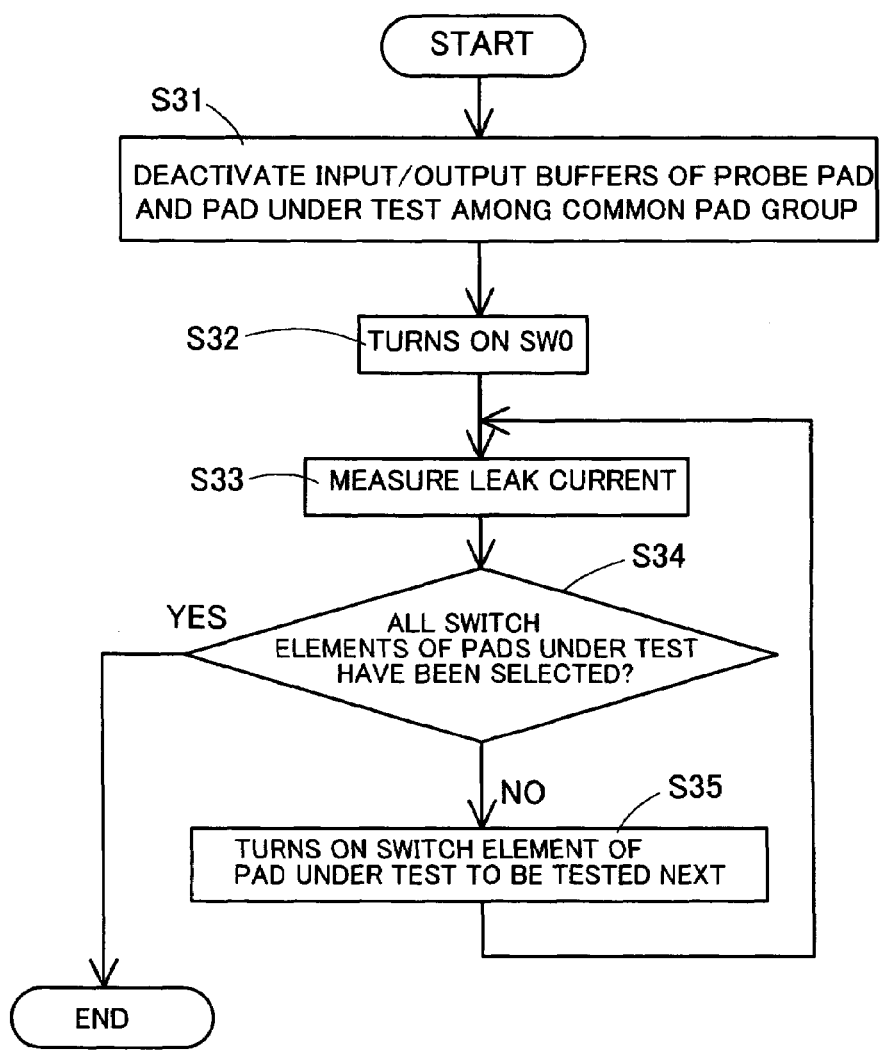
FIG. 4 is an operational flowchart of a second variant of the first embodiment.

FIG. 2 through FIG. 4 show flowchart of the leak current measuring operation based on the circuit arrangement shown in FIG. 1. In FIG. 2 showing the basic measuring operation, step S11 deactivates the input buffers and output buffers of the probe pad P0 and a pad under test among the off-probe pads P1-P4 of a common pad group so that the current path through these buffers are blocked for the leak current measurement of the pad. In case the test signal is put in to the gate electrodes of MOS transistors of the input buffers, in which case the current path from the pads is not formed, this buffer deactivating operation is not needed obviously for input buffers I0-I4. In the circuit block shown in FIG. 1, in which the switch elements SW0-SW4 are connected between the pads P0-P4 and the testing line L0, it is possible to select pads to be tested in an arbitrary combination of the off-probe pads P1-P4 based on the operation of an arbitrary combination of the switch elements.

Next step S12 turns on the switch element SW0 of the probe pad P0 and the switch element of the off-probe pad to be selected for testing thereby to interconnect these pads. In this state, the total leak current of the probe pad P0 and the pad under test is measured with the tester TS through its probe Pr0 at step S13. This leak current measurement enables the detection of defects among the contacts N11-N14 in the contact forming process.

The leak current of the probe pad P0 is always included in the measurement result. The leak current of the sole probe pad P0 can be measured by turning off all the switch elements, and the leak current of the pad under test can be determined as a difference of leak currents measured before and after the switch element of the pad is turned on. The switch element SW0 is kept on during the test, and therefore an alternative arrangement is to connect the probe pad P0 directly to the testing line L0 without using the switch element SW0 in FIG. 1.

At the DC test conducted for the final inspection of semiconductor device, a defective device in terms of the leak current of any input/output pad can be detected by a single measuring operation which is conducted by turning on all the pads P0-P4 of the common pad group, whereby the testing time can be minimized.

FIG. 3 shows flowchart of the leak current measuring operation based on the first variant of the first embodiment. Step S21 deactivates the input buffers and output buffers of the probe pad P0 of a common pad group and the pad under test among off-probe pads P1-P4 of a common pad group as in the case of the first embodiment shown in FIG. 2. Next step S22 turns on the switch element SW0 which is constantly turned on during the DC test of the off-probe pads P1-P4. This step S22 is not needed in case the probe pad P0 is connected directly to the testing line L0 without using the switch element SW0.

Next step S23 measures the leak current of the pads, starting with the probe pad P0. Step S24 checks as to whether or not all switch elements of the pads to be tested have been selected. On judging the end of selection of all switch elements: (yes at S24), the measuring operation terminates. Otherwise: (no at S24), step S25 turns off the switch element of the off-probe pad that has been tested, that is, the pad under test last in step S23, step S26 turns on the switch element of the pad under test next, and the sequence returns to step S23 to measure the leak current of the pad.

The measuring operation of this variant embodiment shown in FIG. 3 is intended to measure the leak current of one pad among the off-probe pads P1-P4 at a time by turning on the switch elements SW1-SW4 sequentially. Accordingly, the leak current of all the off-probe pads P1-P4 and the probe pad P0, which is treated by turning off the all switch elements SW0-SW4, can be measured separately.

FIG. 4 shows flowchart of the leak current measuring operation based on the second variant of the first embodiment. Step S31 deactivates the input buffers and output buffers of the probe pad P0 of a common pad group and the pad under test among off-probe pads P1-P4 of a common pad group as in the case of the embodiments shown in FIG. 2 and FIG. 3. Next step S32 turns on the switch element SW0 which is constantly turned on during DC test of the off-probe pads P1-P4. This step S32 is not needed in case the probe pad P0 is connected directly to the testing line L0 without using the switch element SW0.

Next step S33 measures the leak current of the pads, starting with the probe pad P0. Step S34 checks as to whether or not all switch elements of the pads to be tested have been selected. The operation up to this step is identical to the first variant embodiment of FIG. 3.

On judging the end of selection of all switch elements: (yes at S34), the measuring operation terminates. Otherwise: (no at S34), step S35 turns on the switch element of the pad under test next. Different from the first variant embodiment, the switch element of the pad under test in step S33 is kept on, and therefore another off-probe pad which is selected for measurement is connected additionally to the probe pad P0. The sequence returns to step S33 to measure the leak current of the pads.

In the second variant embodiment, the switch elements SW1-SW4 of the off-probe pads P1-P4 are turned on sequentially and cumulatively. The leak current of each pad can be determined by calculating the difference of leak currents of two contiguous measurements. This variant embodiment simplifies the leak current measurement of individual pads relative to the first variant embodiment of FIG. 3 due to the elimination of the switch element turn-off step. The leak current of the probe pad P0 is measured by turning off the all switch elements SW0-SW4 as in the case of the first variant embodiment.

Although the first embodiment shown in FIG. 1 has the provision of the switch elements SW0-SW4 between the pads P0-P4 and the testing line L0, the leak current measuring operation based on the cumulative connection of pads of the second variant embodiment can be applied to it even in the case of direct connection of the pads P0-P4 by the switch elements without having the testing line L0.

Figure 5:
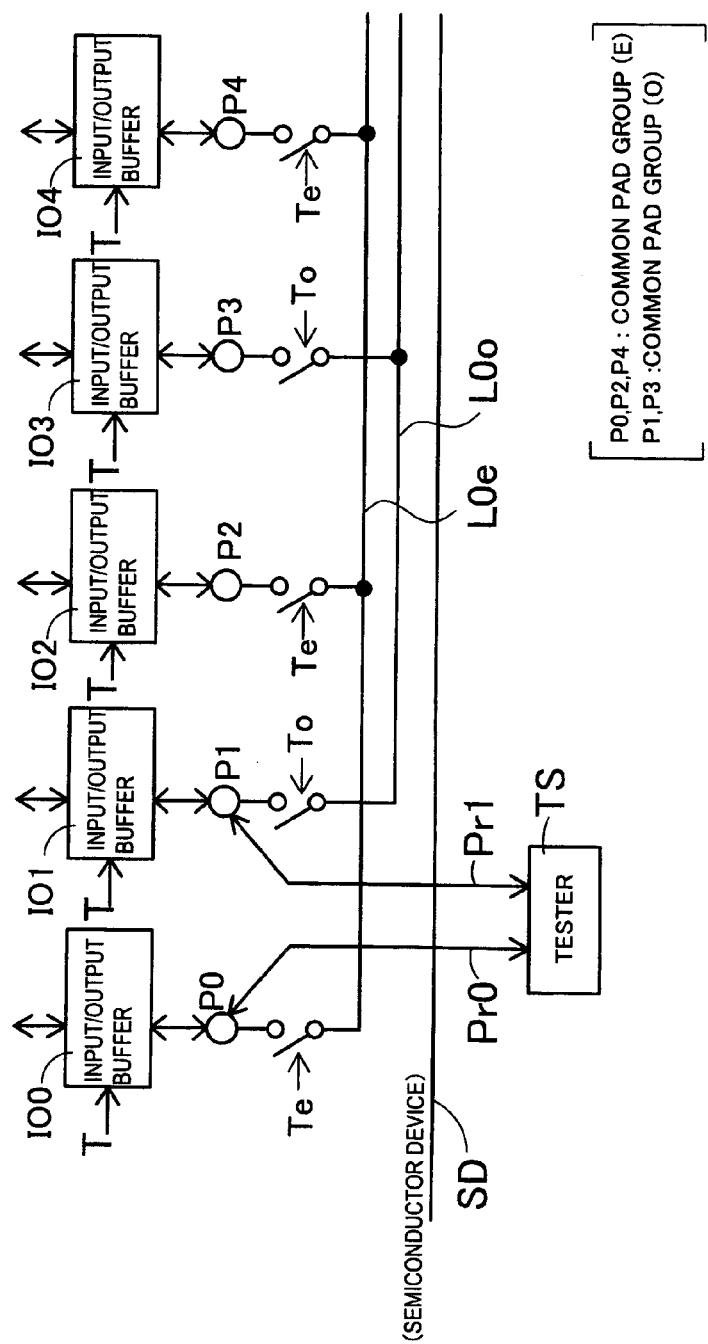
FIG. 5 is a schematic block diagram of a third variant of the first embodiment.

FIG. 5 shows block diagram of the leak current measuring circuit based on the third variant of the first embodiment. Different from the arrangement of FIG. 1 in which a common pad group includes the pads P0-P4, this variant embodiment has one common pad group (E) including pads P0, P2 and P4 and another common pad group (O) including pads P1 and P3, with adjacent pads belonging to different pad groups.

The common pad group (E) has a probe pad P0 and the common pad group (O) has a probe pad P1, with both probe pads being made in contact with the probes Pr0 and Pr1, respectively, of the tester TS. The common pad groups (E)

and (O) have separate testing lines L0e and L0o, respectively. The probe pad P0 and off-probe pads P2 and P4 are connected to the testing line L0e by respective switch elements which are operated by a control signal Te, and the probe pad P1 and off-probe pad P3 are connected to the testing line L0o by respective switch elements which are operated by another control signal To. The pads P0-P4 are connected to the respective input/output buffers IO0-IO4.

Due to the different common pad groups (E) and (O) to which adjacent pads belong, it is possible to measure the leak current between adjacent pads based on the application of different bias voltages to these common pad groups. The tester TS can set the magnitudes and polarities of bias voltages arbitrarily, and it can readily deal with a leak current path with diode characteristics and a leak current path with nonlinear resistance characteristics against the applied voltage. The remaining role of the common pad groups (E) and (o) is the same as the preceding embodiments shown in FIG. 1 through FIG. 4.

Figure 6:
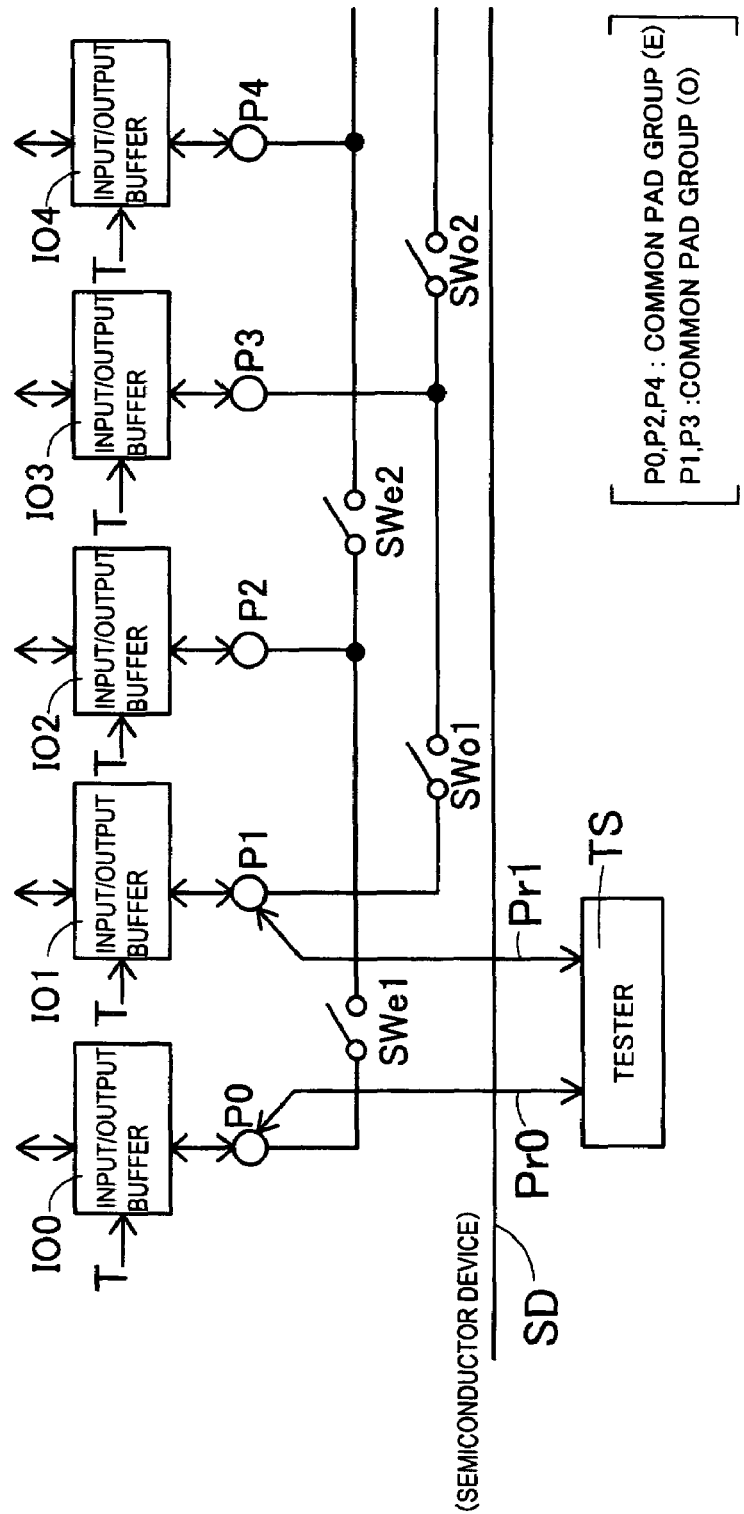
FIG. 6 is a schematic block diagram of a fourth variant of the first embodiment.

FIG. 6 shows block diagram of the leak current measuring circuit based on the fourth variant of the first embodiment. Different from the third variant embodiment of FIG. 5, in which each pad is connected to the tester TS through the testing lines L0e and L0o, switch elements are provided between adjacent pads, through which pads under test are connected to the probe pads. Specifically, the pads P0, P2 and P4 are grouped through the switch elements SWe1 and SWe2 to form a common pad group (E), and the pads P1 and P3 are grouped through the switch elements SWo1 and SWo2 to form another common pad group (O).

This embodiment performs the measurement of leak current of adjacent pads in the same manner as the third variant embodiment of FIG. 5. The remaining role of the common pad groups (E) and (O) is he same as the preceding embodiments shown in FIG. 1, FIG. 2 and FIG. 4.

Figure 7:
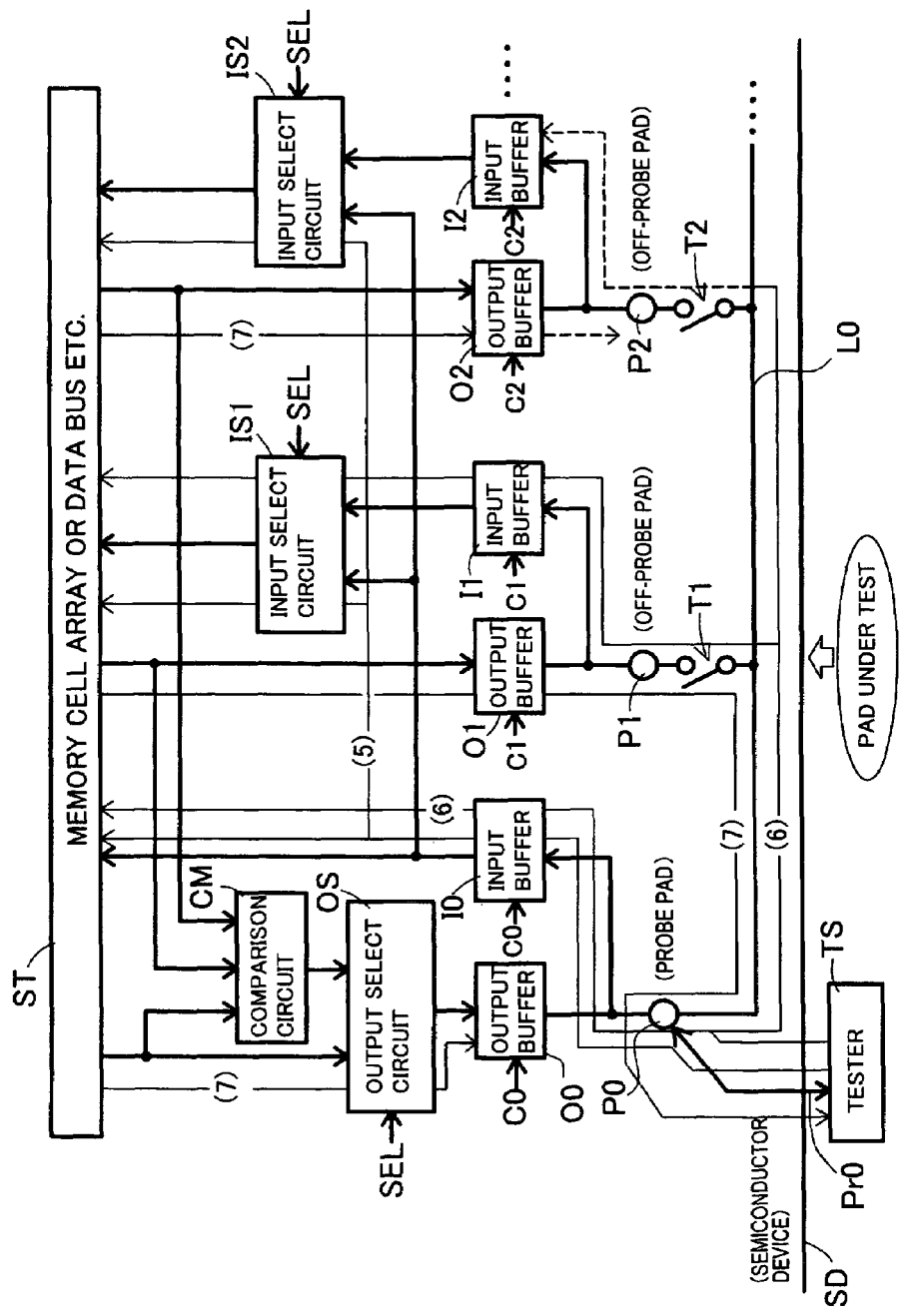
FIG. 7 is a schematic block diagram of a second embodiment of this invention.

FIG. 7 is a block diagram of the second embodiment of this invention, showing a circuit section of semiconductor device including input/output pads P0 through P2 of a common pad group for the pad number compressive test. This circuit arrangement is capable of performing the open-line test for the probe pad P0 which is made in contact with the probe Pr0 of the tester TS, as well as the off-probe pads P1 and P2 which are not made in contact with the probe Pr0.

The arrangement includes input buffers I0-I2 and output buffers O0-O2 for the input/output pads P0-P2 and switch elements connected between the pads P1 and P2 and a testing line L0, which are all identical to the counterparts of the first embodiment of FIG. 1. The testing line L0 is connected directly to the probe pad P0 in this embodiment.

Signals transacted through the input/output pads P0-P2 reach an internal signal storage ST such as a memory cell array or data bus. The input buffers I0-I2 and output buffers O0-O2 are activated or deactivated by control signals C0-C2, respectively. The switch elements which connect the off-probe pad P1 and P2 to the testing line L0 are turned on or off by control signals T1 and T2, respectively.

A signal put in to the probe pad P0 is conducted by the input buffer I0 to the signal storage ST and also delivered to input select circuits IS1 and IS2 of the off-probe pads P1 and P2. The input select circuits IS1 and IS2 also receive signals on the off-probe pads P1 and P2 through the input buffers I1 and I2.

The signal storage ST releases signals to the output buffers O1 and O2 of the off-probe pads P1 and P2 and to an output select circuit OS of the probe pad P0. The output select circuit OS also receives the output signal of a comparison circuit CM which receives the output signals of signal storage ST to be delivered to the probe pad P0 and off-probe pads P1 and P2.

The input select circuits IS1 and IS2 and output select circuit OS receive a select signal SEL, in response to which each circuit selects one of two input signals for the normal input/output operation or the pad number compressive test. The comparison circuit CM judges the equality of the output signals relevant to the pads P0-P2 at the time of pad number compressive test. It releases an output signal indicative of the equality result to the output select circuit OS, and the signal is delivered through the probe pad P0 to the tester TS. The input select circuits IS1 and IS2, output select circuit OS and comparison circuit CM operate in unison to accomplish the pad number compressive test function.

The input select circuits IS1 and IS2 may be designed to deliver the inverted data of output data of the input buffer I0 to the signal storage ST, with the inverted data being also put in to the comparison circuit CM.

Figure 8:
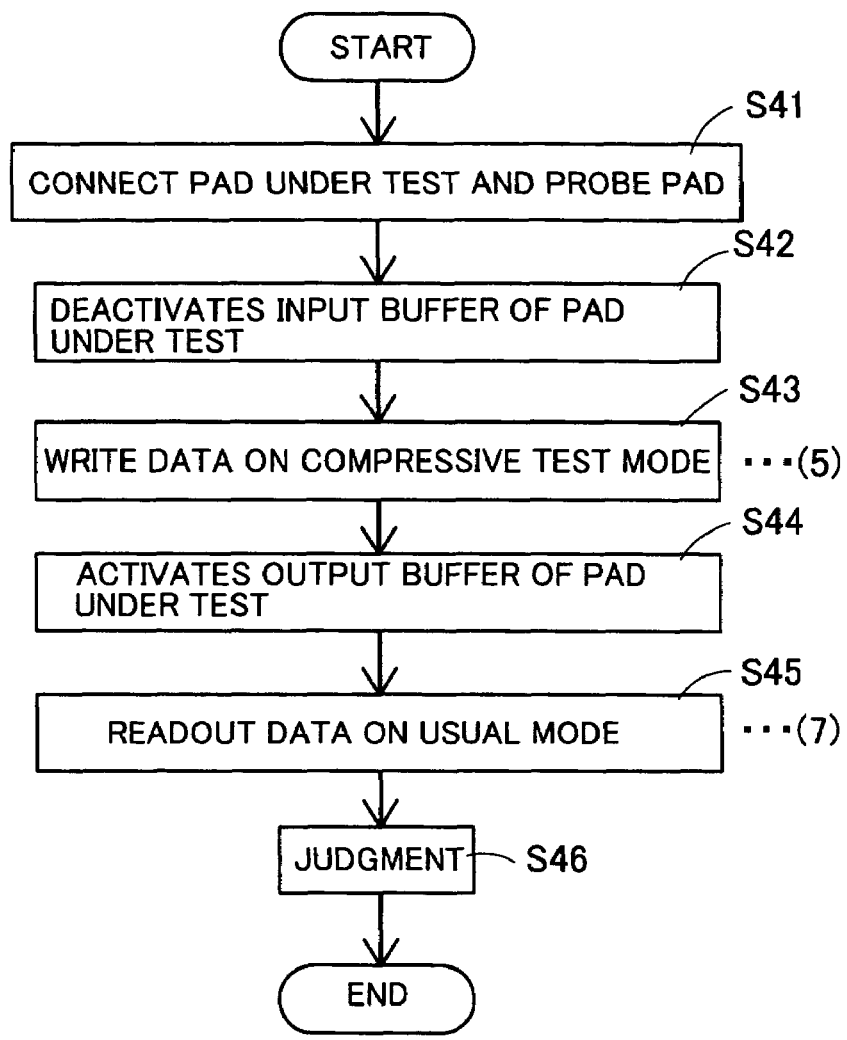
FIG. 8 is an operational flowchart of a first variant of the second embodiment.
Figure 9:
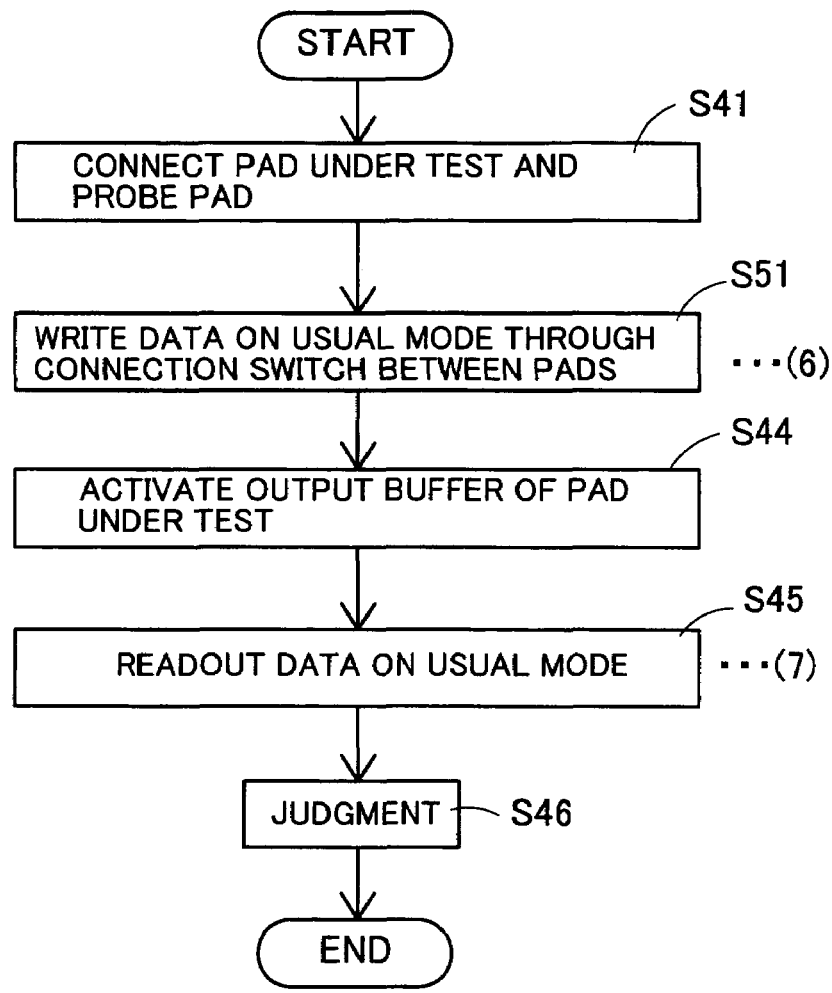
FIG. 9 is an operational flowchart of a second variant of the second embodiment.

FIG. 8 and FIG. 9 show flowchart of the open-line test operations based on the second embodiment of this invention performed by the circuit arrangement shown in FIG. 7.

In the first variant of the second embodiment of FIG. 8, step S41 connects a pad under test (pad P1) among the off-probe pads P1 and P2 to the probe pad P0. Specifically, the switch element of the off-probe pad P1 is turned on by the active control signal T1. Next step S42 deactivates the input buffer I1 of the pad P1 by the control signal C1 so that the signal path unnecessary for the test signal of pad number compressive test is blocked.

Following these preparatory steps, step S43 implements the signal input over the signal route indicated by (5) in FIG. 7 based number compressive test mode. The test signal put in to the probe pad P0 is stored through the input buffer I0 into the signal storage ST in its section for P0 and, at the same time, selected by the input select circuits IS1 and IS2 and stored into the sections for pads P1 and P2 of the signal storage ST.

Subsequently, step S44 activates the output buffer O1 of the pad P1 under test by the control signal C1. The control signals C0 and C2 are inactive at this time, and the output buffers O0 and O2 are kept deactivated.

Step S45 implements the usual signal output over the signal route indicated by (7) in FIG. 7. Among the signals released by storage ST from its respective sections toward the pads P0-P2, the signal is conducted by the activated output buffer O1 to the pad P1 under test, while the signals to the pads P0 and P2 are blocked by the deactivated output buffers O0 and O2. Since the switch element between the pad P1 under test and the probe pad P0 has been turned on at step S41, the signal put out to the pad P1 is transferred through the pad P0 and probe Pr0 to the tester TS, by which the output signal is examined in step S46.

In this manner, the normality of the signal line from the signal storage ST to the output buffer O1 and to the off-probe pad P1, inclusive of the operation of the output buffer O1, can be verified.

The signal input step S43, in an operational flowchart of FIG. 8, which is based on the pad number compressive test mode, puts the test signal in to all off-probe pads P1 and P2 at once.

Thereby signal input can be made at once at the beginning of the open-line test, and the subsequent signal output step S45 reads out a signal from the signal storage ST while selecting pad under test from among the off-probe pads P1 and P2 sequentially. The simultaneous signal input operation at step S43 reduces the time expense for the open-line test in the DC test.

The input select circuits IS1 and IS2 may be designed to have a logical inversion function for the input signals.

With the logical inversion function being activated and deactivated alternately for the input select circuits IS1 and IS2 of the off-probe pads P1 and P2, a test signal which is put in based on the pad number compressive test mode is treated to have alternate logic levels for the pads P1 and P2 and stored into the signal storage ST. Accordingly, the output signals of the pads at the sequential signal output operations of step S45 have opposite logic levels, allowing the tester TS to receive the signals in a short time even in the presence of a large parasitic capacitance on the signal lines from the pads P1 and P2 to the tester TS.

Although the step S41 of connecting the pad P1 to the probe pad P0 is implemented prior to the signal input at step S43 in the first variant embodiment shown in FIG. 8, the step S41 merely needs to take place before the commencement of signal output at step S45, and it may be moved to take place between the steps S43 and S44 or between the steps S44 and S45.

Although the input buffer I1 of the pad P1 is deactivated at step S42 in this variant embodiment of FIG. 8, the input signal route for the pad number compressive test is selected by the input select circuit IS1 and therefore the step S42 of input buffer deactivation may be eliminated.

FIG. 9 shows the second variant of the second embodiment of the open-line test operation, in which the usual signal input takes place at step S51 over the signal route indicated by (6) in FIG. 7 in place of the signal input based on the pad number compressive test function in the previous variant embodiment of FIG. 8. In addition, the step S42 of deactivating the input buffer I1 of the pad P1 in the previous variant embodiment is unnecessary, but on the contrary the input buffer I1 needs to be activated.

The test signal put in to the probe pad P0 is stored through the input buffer I0 into the signal storage ST in its section for P0 and, at the same time, conducted by the switch element which is turned on by the control signal T1 to the pad P1 under test and stored through the input buffer I1 and input select circuit IS1 into the section for P1 of the signal storage ST. At this time, the input buffer I2 for the unselected off-probe pad P2 is preferably deactivated by using the control signal C2 so as to avoid the unneedful input of a voltage level on the pad P2 into the signal storage ST. This unneedful procedure may be neglected in case the pad P2 does not affect the open-line test of the pad P1.

In this manner, the normality of the signal line from the off-probe pad P1 to the input buffer I1 and to the signal storage ST, inclusive of the operation of the input buffer I1, and the signal line from the signal storage ST to the output buffer O1 and to the off-probe pad P1, inclusive of the operation of the output buffer O1, can be verified.

In the variant embodiment of FIG. 9, the off-probe pad P1 is selected for testing, and the signal input step S51 stores the test signal into the signal storage ST at its location for P1. In this manner, each off-probe pad is selected to undergo the open-line test which is performed as shown by the flowchart of FIG. 9.

As another variant of this embodiment, the signal input step S51 may be altered to implement the signal input at once to all pads under test among the off-probe pads P1 and P2 as in the case of the signal input step S43 based on the pad number compressive test mode in the first variant embodiment of FIG. 8. In this case, the step S41 turns on the switch elements so that all pads under test are connected to the probe pad P0.

In this manner, the test signal is put in to all pads under test at once at the beginning of the open-line test, and the subsequent signal output step S45 reads out a signal from the signal storage ST while selecting a pad under test from among the off-probe pads P1 and P2 sequentially. The simultaneous signal input operation of step S51 reduces the time expense for the open-line test in the DC test.

The signal storage ST of the second embodiment shown in FIG. 7 can be a memory cell array, data bus, or a latch circuit provided on the bus. In the case of arrangement in which the test signal is not stored into memory cells, the entered and held signals can be read out reliably in the DC test which is carried out occasionally before defective memory cells detected by the AC test are replaced with redundancy memory cells. The DC test does not necessitate an additional step of inhibiting the output of erroneous signals caused by defective memory cells, and the open-line test in the DC test can be performed simply and reliably.

The second embodiment also can have the grouping of pads as shown in FIG. 5 for the third variant embodiment of the first embodiment or the provision of switch elements between adjacent pads as shown in FIG. 6 for the fourth variant embodiment of the first embodiment, and the same performance as the preceding ones are accomplished obviously.

Figure 10:
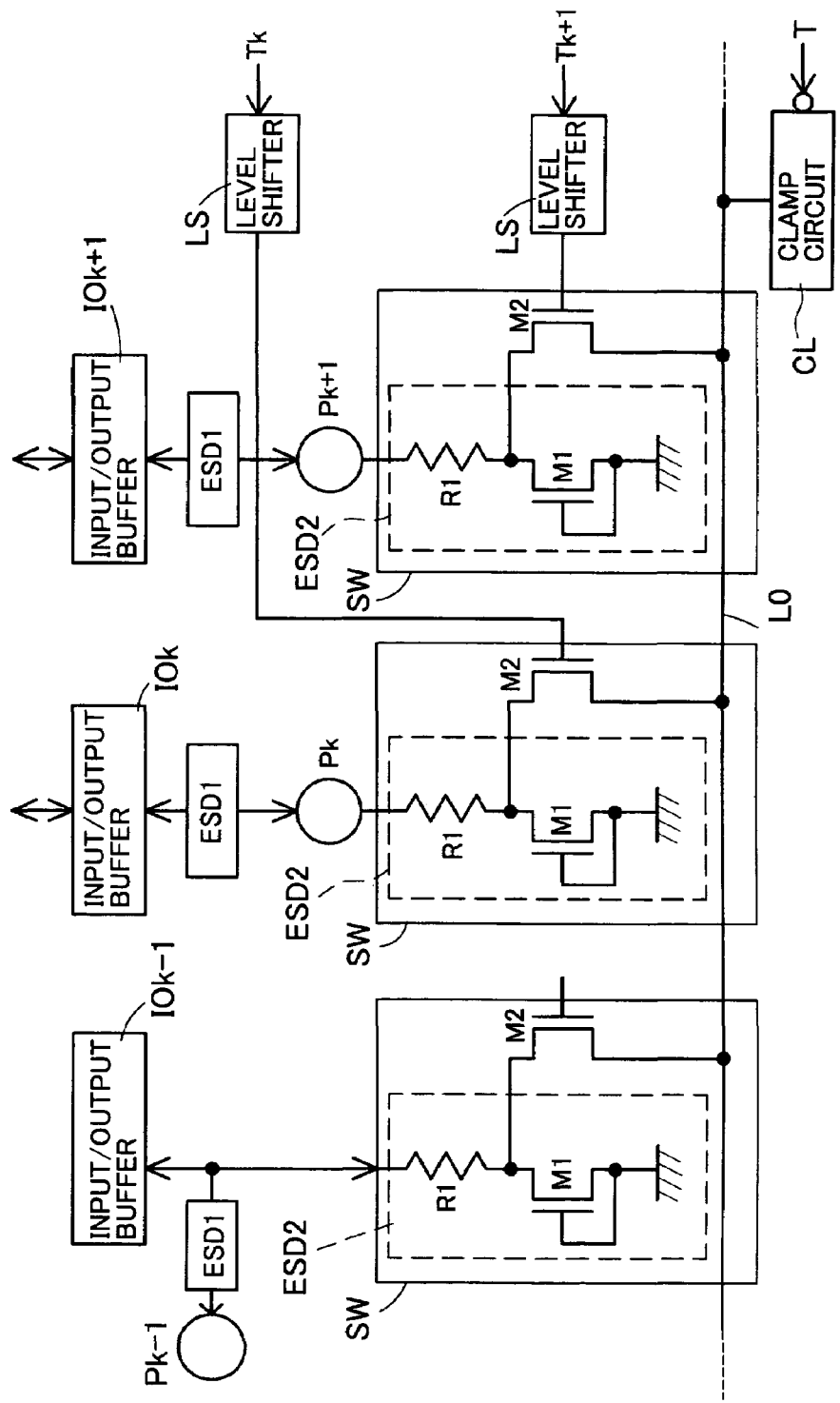
FIG. 10 is a schematic block diagram of a third embodiment of this invention.

FIG. 10 shows block diagram of the circuit arrangement of and around the switch elements SW which are provided between adjacent input/output pads Pk and Pk+1 and the testing line L0. As a general design scheme of semiconductor device, the internal input/output buffers IOk and IOk+1 are protected from breakage caused by the electrostatic stress from the pads Pk and Pk+1 based on the provision of electrostatic protection circuits ESD1 between the pads Pk and Pk+1 and the input/output buffers IOk and IOk+1.

However, switching transistors M2 as the switch elements SW are occasionally connected directly to the pads Pk and Pk+1 without being interposed by the electrostatic protection circuits ESD1 due to the layout design of semiconductor device. In another case, the switching transistors M2 which is connected through the electrostatic protection circuit ESD1 as in the case of pad Pk−1 is not protected effectively by the protection circuit ESD1 which is designed for the input/output buffers IOk and IOK+1 due to their difference in circuit arrangement and transistor capacity.

On this account, the switch elements SW are preferably designed to include their own electrostatic protection circuits ESD2 for the switching transistor M2 as shown in FIG. 10. The electrostatic protection circuit ESD2 is made up of a MOS transistor M1 which discharges the electrostatic stress from the pad and a current limiting resistor R1. The switching transistor M2 is connected to the node between the MOS transistor M1 and the resistor R1. The MOS transistor M1 is more active to discharge the electrostatic stress by having a smaller gate length relative to the switching transistor M2 which has a larger gate length relatively. In consideration of the latch-up durability, the electrostatic protection circuits ESD1 and ESD2 are preferably formed in different bulk areas, or formed by being separated by a guard ring which prevents the bipolar operation and thyristor operation.

Based on the provision of the electrostatic protection circuits ESD2, the switch elements (transistors) SW are protected from the electrostatic stress from the input/output pads. Erroneous operations caused by latch-up, etc. can be prevented based on the formation of the electrostatic protection circuits ESD1 and ESD2 in different bulk areas or formed by being separated by a guard ring which prevents the bipolar operation and thyristor operation.

The switching transistors M2 have their control signals Tk and Tk+1 on the gate electrodes shifted in voltage level by a level shifter LS. Specifically, the switching transistors M2 are turned on by a control signal voltage which is higher than the high voltage level of the input/output signals applied to the pads Pk and Pk+1 and still higher than the threshold voltage of M2. In consequence, the switching transistors M2 can be turned on firmly so that the voltage level of signals transacted through the switching transistors M2 is not varied.

The switching transistors M2 are turned off by a control signal voltage which is lower than the low voltage level of the input/output signals applied to the pads Pk and Pk+1. In consequence, even if an under-shoot noise which is lower in voltage than the low voltage level of the input/output signals is applied to the pads Pk and Pk+1, the switching transistors M2 can be turned off firmly.

Figure 11:
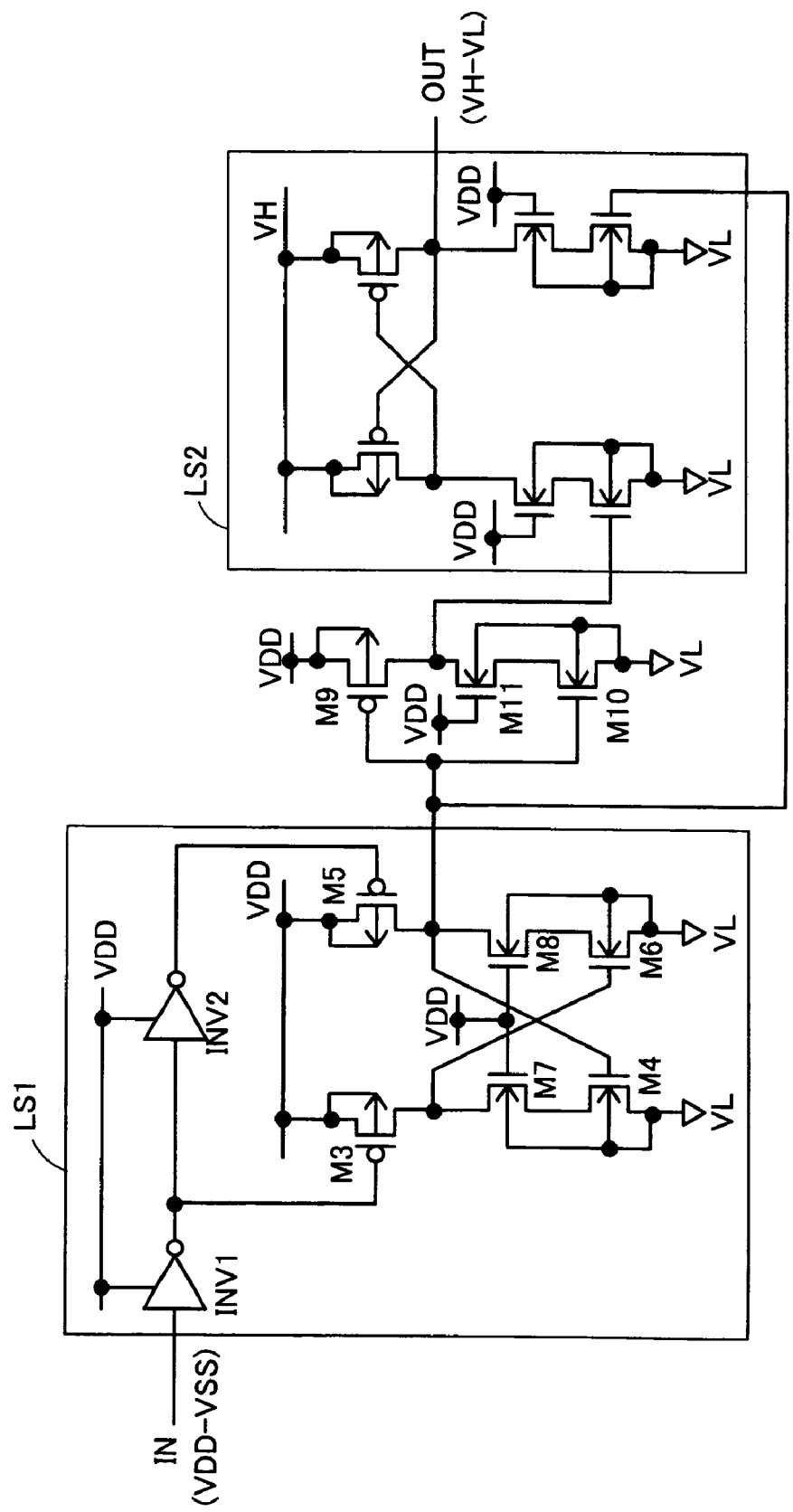
FIG. 11 is a schematic circuit diagram of the level shifter shown in FIG. 10.

FIG. 11 shows an specific circuit arrangement of the level shifter LS shown in FIG. 10. This level shifter releases a step-up voltage VH for the high-level voltage and a negative voltage VL for the low-level voltage. The step-up voltage VH can be the voltage used for the word line activation signal or external power that uses power voltage stepped down by internal step-down-voltage power, and the negative voltage VL can be the back-gate bias voltage applied to the p well or p-type substrate or the voltage used for the word line deactivation signal.

The level shifter LS is arranged in two stages including a former stage LS1 and a latter stage LS2. The former stage LS1 has an input signal IN having the power voltage VDD or reference voltage VSS, and shifts the reference voltage level from the reference voltage VSS to the negative voltage VL. The latter stage LS2 shifts the high-level voltage from the power voltage VDD to the step-up voltage VH, and releases an output signal OUT having a voltage between the step-up voltage VH and the negative voltage VL. The latter stage LS2 is opposite in arrangement to the former stage LS1 in terms of the connection of PMOS transistors and NMOS transistors. Since both stages operate similarly, the following explains in detail the former stage LS1.

First, the input signal IN is assumed to be a high-level signal having a level of the power voltage VDD. The signal IN is put in through an inverter INV1 applying the power voltage VDD, and to gate electrode of a PMOS transistor M3 and also to another inverter INV2 to which the power voltage VDD is applied. The PMOS transistor M3 having a gate input of the low-level inverted signal of the input signal IN turns on, applying the voltage VDD to the gate electrode of an NMOS transistor M6, which then turns on. The inverter INV2 releases a high-level re-inverted signal to the gate electrode of a PMOS transistor M5, which then turns off. Accordingly, the NMOS transistor M6 provides the negative voltage VL for the output signal through a voltage dividing NMOS transistor M8, and the reference voltage level is shifted from the reference voltage VSS to the negative voltage VL. The output signal is put in to the gate electrode of a NMOS transistor M4, causing it to turn off, and the path of negative voltage VL to the gate electrode of NMOS transistor M6 is blocked.

Next, the input signal is assumed to be a low-level signal having a level of the reference voltage VSS. The inverter INV1 releases an inverted high-level inverted signal, causing the PMOS transistor M3 to turn off, and the path of voltage VDD to the gate electrode of NMOS transistor M6 is blocked. The inverter INV2 releases a re-inverted low-level signal to the gate electrode of the PMOS transistor M5, which then turns on. The PMOS transistor M5 provides the power voltage VDD for the output signal. The output signal is put in to the gate electrode of NMOS transistor M4, which then turns on to apply the negative voltage VL to the gate electrode of NMOS transistor M6, which then retains the off state. The voltage dividing transistors M7 and M8 have the application of power voltage VDD on their gate electrodes, and accordingly the maximum voltage appearing on their source electrodes is limited to the voltage VDD subtracted by the threshold voltage. Consequently, the maximum voltage applied to the drain electrodes of NMOS transistors M4 and M6 having the application of negative voltage VL on their source electrodes is limited to the voltage VDD subtracted by the threshold voltage, and the voltage applied between the source and drain electrodes of NMOS transistors M4 and M6 can be kept within electrically insulatable voltage.

The signal having a level of power voltage VDD or negative voltage VL outputted from the former stage LS1 is inverted by an inverter circuit including a voltage dividing transistor, and put in to the latter stage LS2. The latter stage LS2 shifts the high-voltage level and releases an output signal OUT having a voltage level of step-up voltage VH or negative voltage VL.

Returning to FIG. 10, the testing line L0 is connected with a clamp circuit CL. The clamp circuit CL receives the control signal T which becomes active at the DC test, and it is activated when the control signal T is inactive. The DC test for the off-probe pads is performed through the testing line L0 while the clamp circuit CL is deactivated. The circuit CL is activated on completion of DC test thereby to clamp the testing line L0 to the prescribed voltage so that it does not float due to the absence of on-state switch element except during the DC test.

Figure 12:
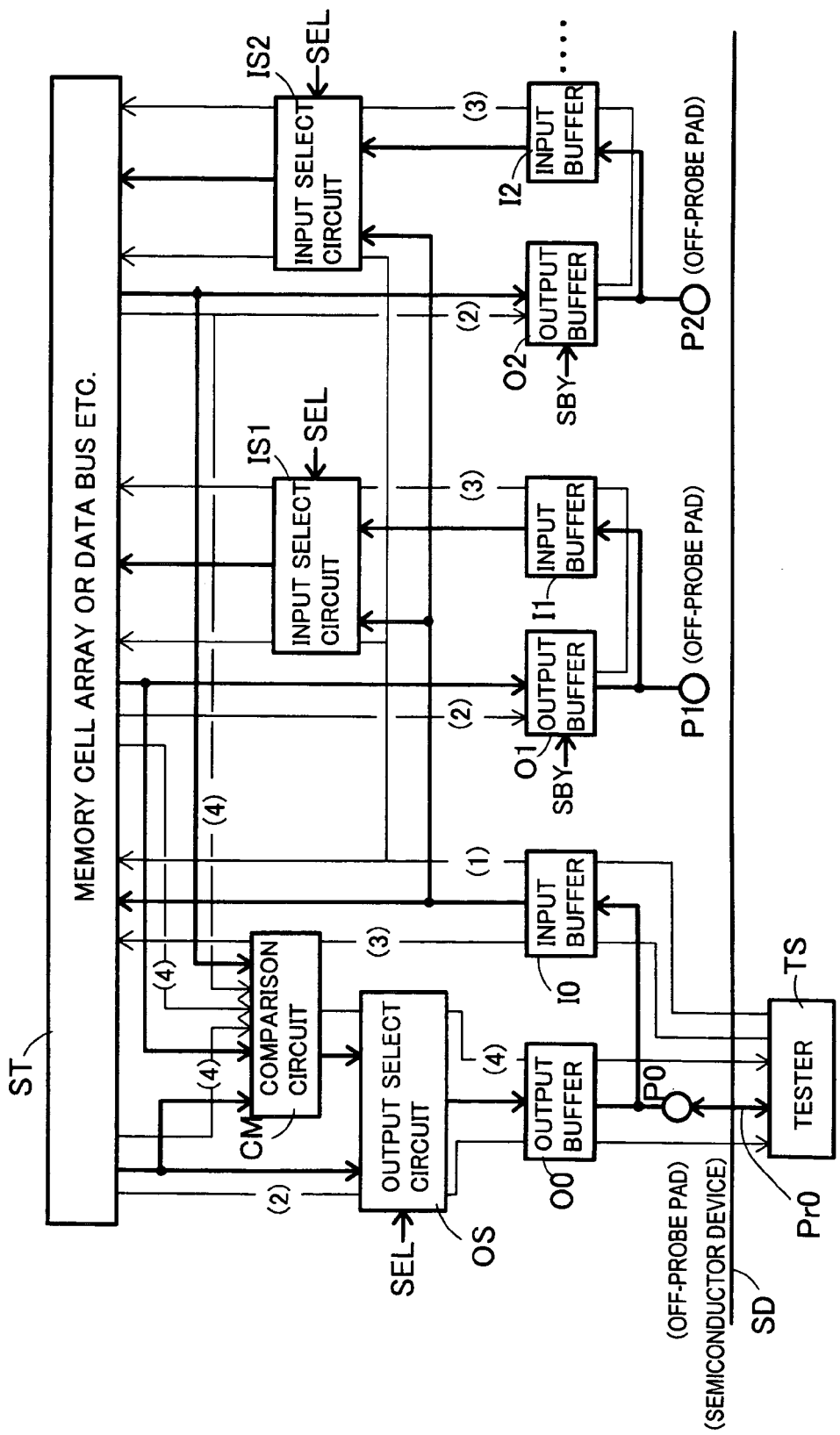
FIG. 12 is a schematic block diagram of a fourth embodiment of this invention.

FIG. 12 shows by block diagram the semiconductor device SD having the pad number compressive test mode based on the fourth embodiment of this invention. This circuit arrangement is derived from the second embodiment shown in FIG. 7, with the testing line L0 and switch elements being removed, and it is a usual arrangement for a semiconductor device having the pad number compressive test mode. The off-probe pads P1 and P2 have their output buffers O1 and O2 deactivated by an input control signal SBY. The input buffers I0-I2 are assumed to have their input terminals on the gate electrodes of MOS transistors, and have no input control signal for deactivation.

Figure 13:
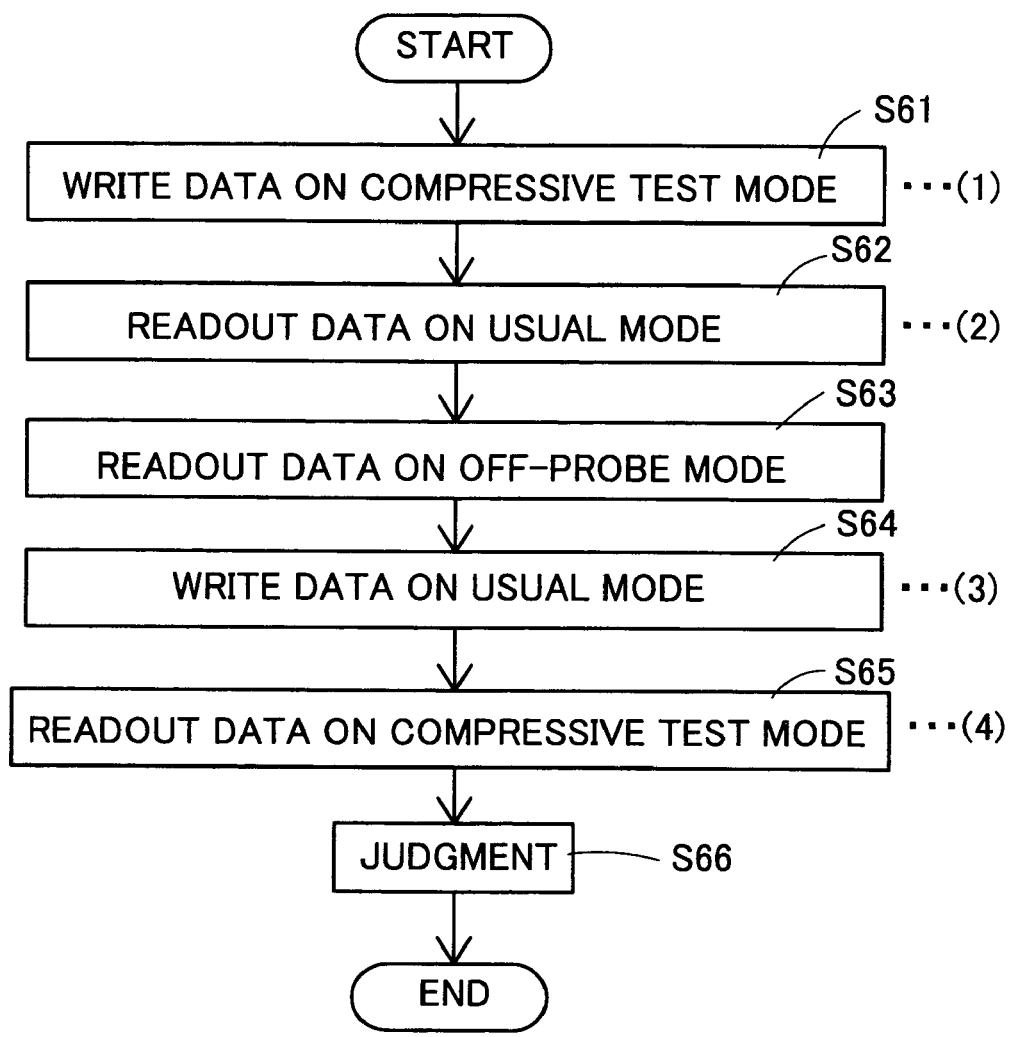
FIG. 13 is an operational flowchart of the fourth embodiment.

FIG. 13 shows flowchart of the leak current measuring operation for the off-probe pads P1 and P2 of this usual semiconductor device SD. Step S61 puts a test signal in to the pads P0-P2 of a common pad group based on the pad number compressive test mode. Next step S62 cancels the pad number compressive test mode and implements the usual signal output operation. Following the signal output, step S63 deactivates the output buffers O1 and O2 of the pads P1 and P2 by the control signal SBY. On expiration of a certain time length, step S64 implements another signal input by the usual signal input operation. Step S65 reads out the signals to the probe pad P0 based on the pad number compressive test mode, and step S66 verifies the output signals with the tester TS.

The prescribed time length to be expended between the steps S63 and S64 is dependent on the allowable leak current value of the off-probe pads P1 and P2. The output signals of step S62 are accumulated in the parasitic capacitance of the off-probe pads P1 and P2, input buffers I1 and I2, output buffers O1 and O2 and lines after the output buffers O1 and O2 have been deactivated at step S63. This accumulated charges are discharged gradually as a leak current. By setting the prescribed time length to be the time when the pad voltage level of parasitic capacitance reverses by the successive discharge in excess of the allowable leak current, the second signal input takes place by being logically inverted for the voltage level of a pad having a leak current in excess of the allowable value. The tester TS senses the inverted signal to detect an excessive leak current over the allowable value.

Figure 14:
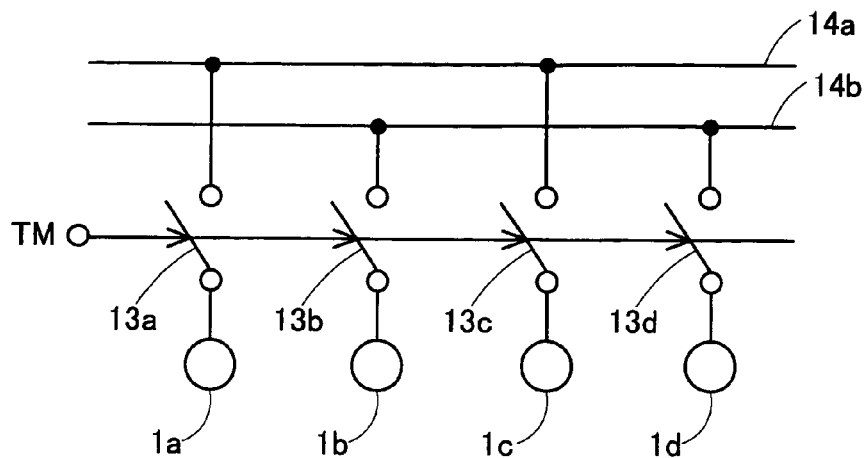
FIG. 14 is a conceptual diagram of a fifth embodiment of this invention.

FIG. 14 is a conceptual diagram of the fifth embodiment of this invention. Input/output pads 1a-1d are connected to testing lines 14a, 14b through switch elements 13a-13d which are turned on by a switch control signal TM so that the number of input/output pads is compressed for the operation test. In this case, adjacent pads are connected to different testing lines as shown.

The following explains specific circuit arrangements of the fifth embodiment shown in FIG. 14 as a first through seventh variant of the fifth embodiment.

Figure 15:
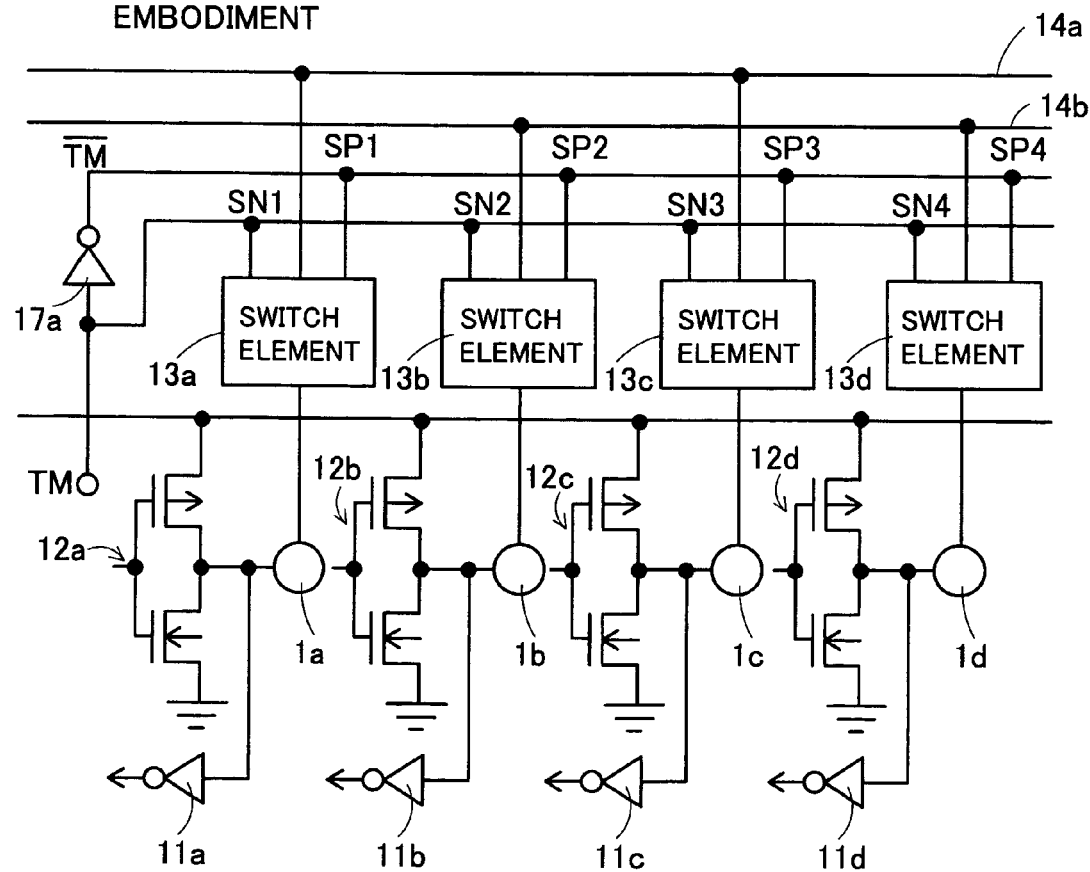
FIG. 15 is a schematic circuit diagram of a first variant of the fifth embodiment.

FIG. 15 shows the first variant embodiment. The input/output pads 1a-1d are connected to the input terminals of input buffers 11a-11d, respectively, so that the input signals put in to the input/output pads 1a-1d are conducted through the input buffers 11a-11d into the internal circuit.

The input/output pads 1a-1d are also connected to the output nodes of output buffers 12a-12d, respectively, so that the output signals from the internal circuit are read out through the output buffers 12a-12d to the input/output pads 1a-1d.

Among the input/output pads 1a-1d, every two input/output pads 1a and 1c are connected through the switch elements 13a and 13c to the testing line 14a, and another every two input/output pads 1b and 1d are connected through the switch elements 13b and 13d to the testing line 14b.

The switch elements 13a-13d receive a switch control signal TM which is brought to the high level by the internal circuit at the operation test and also receive the inverted version thereof /TM provided by an inverter 17a.

Figure 16:
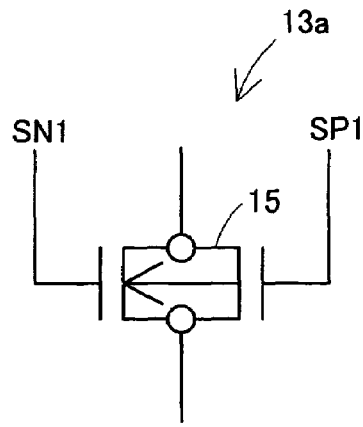
FIG. 16 is a schematic circuit diagram of the switch element.

The switch elements 13a-13d are each formed of a transfer gate 15 as shown in FIG. 16. The transfer gates 15 receive the switch control signal TM on their input terminals SN1-SN4 and the inverted version /TM on their input terminals SP1-SP4.

The transfer gate 15 is made conductive by a high-level switch control signal TM and low-level signal /TM, and the switch elements 13a-13d turn on simultaneously.

At the time of operation test, the input/output pads 1a and 1c are short-circuited and the input/output pads 1b and 1d are short-circuited in response to the switch control signals TM and /TM, while adjacent pads are not short-circuited.

By putting a test signal in solely to the input/output pads 1a and 1b in this state, all the pads 1a-1d can be tested at the same condition without putting the test signal in to the pads 1c and 1d. Namely, the four input/output pads 1a-1d are compressed to the two pads 1a and 1b for the operation test.

At the time of leak current test, different voltages are applied to the input/output pads 1a and 1b by the tester, while all the switch elements 13a-13d are kept on. If there is an internal short-circuit between the pads 1a and 1b, it is detected by the tester in terms of a leak current flowing through the pads 1a and 1b.

Similarly, if there is an internal short-circuit between the pads 1c and 1d, it is detected by the tester in terms of a leak current flowing through the pads 1c and 1d.

In the normal operation of the semiconductor device, the switch control signals TM and /TM are low and high, respectively, causing the switch elements 13a-13d to be kept off, and the input/output pads 1a-1d are disconnected from the testing lines 14a and 14b. The input/output pads 1a-1d transact signals with the internal circuit through the ordinary lines (not shown).

The test circuit of semiconductor device arranged as described above achieves the following effectiveness.

(1) Based on the compression of the number of input/output pads to be connected for the operation test, an increased number of pads can be tested at once and thus the device testing time can be reduced.

(2) Based on the leak current test, with the number of input/output pads being compressed, the testing tool can be shared with other test.

(3) Based on the sharing of testing tool with other test, the testing cost can be reduced.

Figure 17:
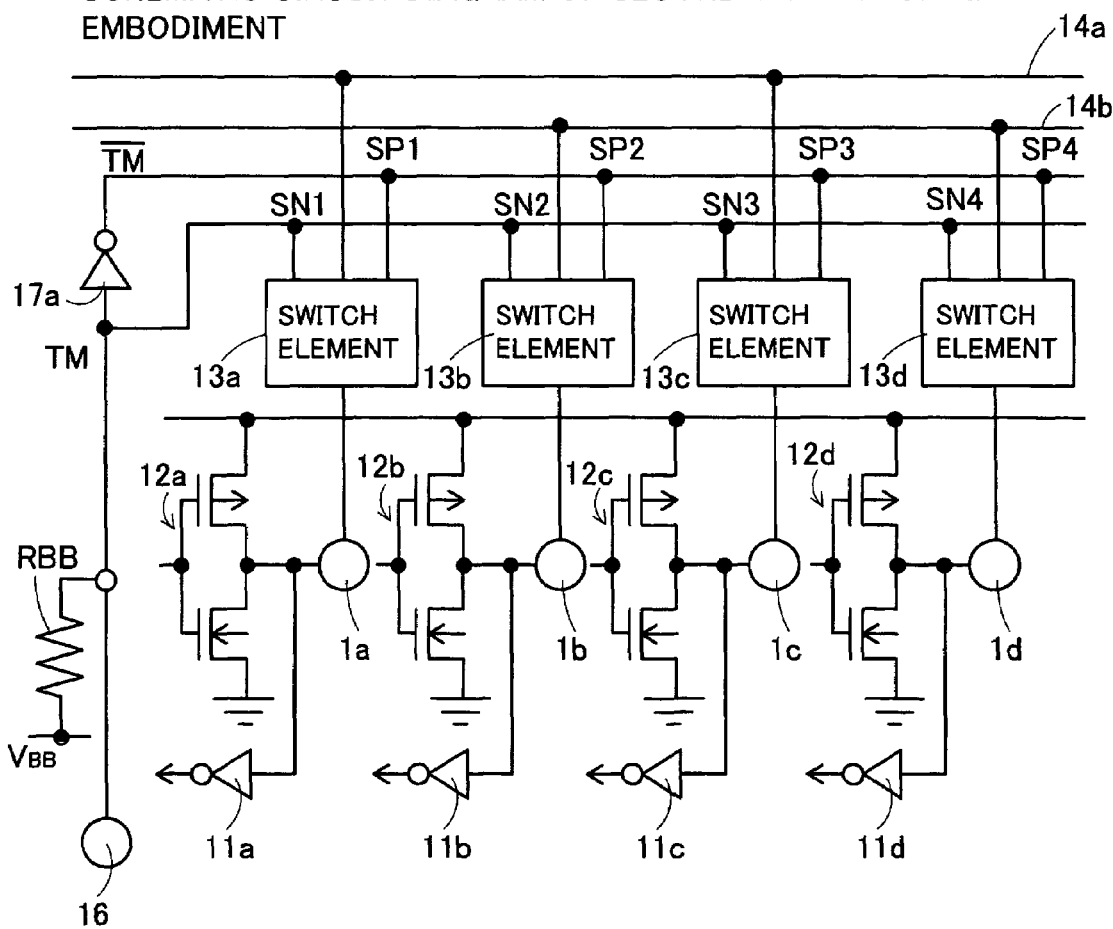
FIG. 17 is a schematic circuit diagram of a second variant of the fifth embodiment.

FIG. 17 shows the second variant embodiment. The switch control signal TM is supplied from the tester through a switch control pad 16 at the time of operation test.

The switch control pad 16 is pulled to the substrate voltage VBB through a high-resistance resistor RBB. The remaining circuit arrangement is the same as the first variant embodiment.

The switch elements 13a-13d turn on in response to the input of a high-level switch control signal TM to the switch control pad 16 at the time of operation test.

Therefore, the same operation test and leak current test as the first variant embodiment are performed. In the normal operation without the input of a high-level switch control signal TM, the switch control pad 16 is pulled to the low level of the substrate voltage VBB through the high-resistance resistor RBB, and the switch elements 13a-13d are off to disconnect the input/output pads 1a-1d from the testing lines 14a and 14b. The input/output pads 1a-1d transact signals with the internal circuit through the ordinary lines (not shown).

The test circuit of this variant embodiment accomplishes the same performance as the preceding first variant embodiment by being supplied with the switch control signal TM from the tester.

Figure 18:
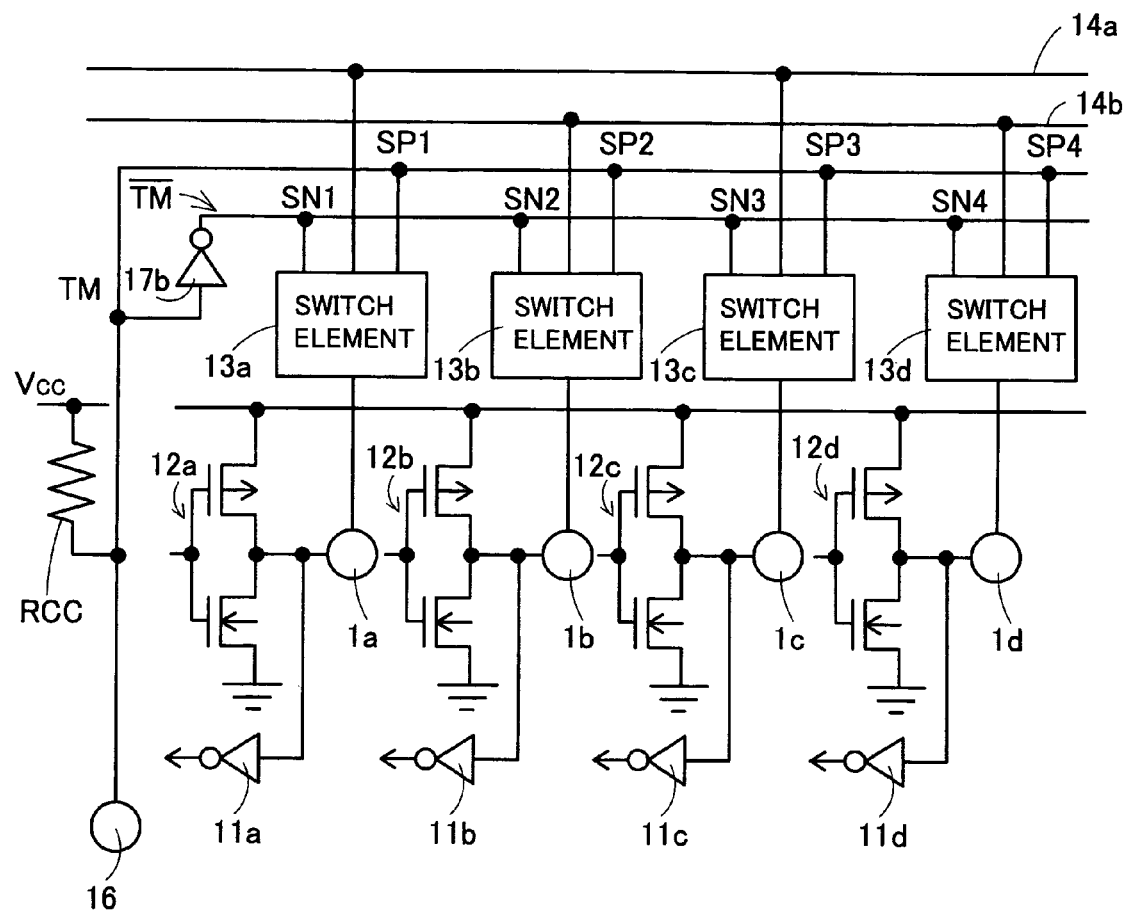
FIG. 18 is a schematic circuit diagram of a third variant of the fifth embodiment.

FIG. 18 shows the third variant embodiment. The switch control pad 16 is pulled to the power voltage VCC through a resistor RCC. The switch elements 13a-13d receive the switch control signal TM on their input terminals SP1-SP4 and the inverted version thereof /TM on their input terminals SN1-SN4. The remaining circuit arrangement is the same as the second variant embodiment.

The switch elements 13a-13d turn on in response to the input of a low-level switch control signal TM to the switch control pad 16 from the tester at the time of operation test, and the same operation test and leak current test as the first variant embodiment are performed.

In the normal operation without the input of a low-level switch control signal TM, the switch control pad 16 is pulled to the high level of power voltage VCC through the resistor RCC, and the switch elements 13a-13d are off to disconnect the input/output pads 1a-1d from the testing lines 14a and 14b. The input/output pads 1a-1d transact signals with the internal circuit through the ordinary lines (not shown).

The test circuit of this variant embodiment accomplishes the same performance as the preceding second variant embodiment.

Figure 19:
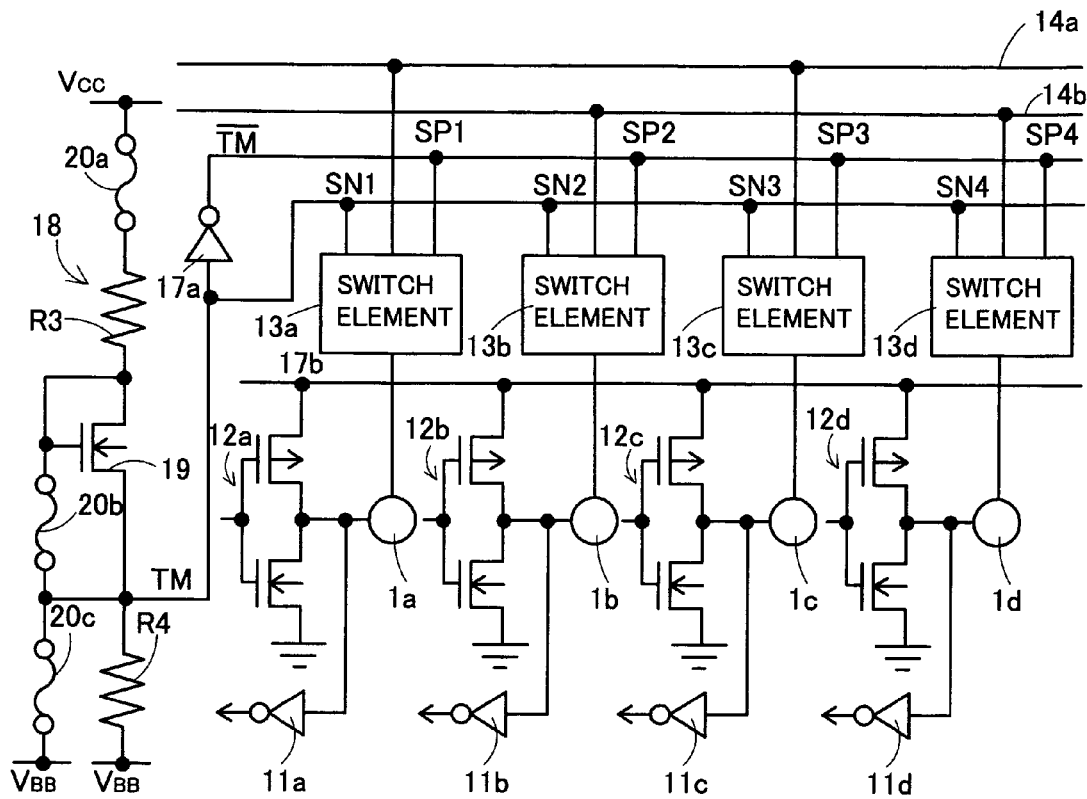
FIG. 19 is a schematic circuit diagram of a fourth variant of the fifth embodiment.

FIG. 19 shows the fourth variant embodiment. The switch control signal TM is produced by a switch control signal generation circuit 18 within the semiconductor device.

The switch control signal generation circuit 18 includes an n-channel MOS transistor 19 having its drain electrode connected to the VCC power line through a resistor R3 an fuse 20a and its source electrode connected to the substrate voltage VBB line through a resistor R4 and fuse 20c in parallel connection.

The transistor 19 has its gate electrode connected to the drain electrode and also to the source electrode through another fuse 20b. The transistor 19 releases the switch control signal TM from the source electrode. The remaining circuit arrangement is the same as the first variant embodiment.

At the time of operation test, the fuses 20b and 20c of the test circuit are cut so that the transistor 19 turns on, causing the source voltage to rise to produce a high-level switch control signal TM in accordance with the proper resistance setting for the resistors R3 and R4.

In this state, the switch elements 13a-13d are on, and the same operation test and leak current test as the first variant embodiment are performed.

Following the operation test, the fuse 20a is cut so that the transistor 19 turns off, causing the switch control signal TM to have the low level of the substrate voltage VBB.

In this state, the switch elements 13a-13d are off, disconnecting the input/output pads 1a-1d from the testing lines 14a and 14b. The input/output pads 1a-1d are connected to the internal circuit for signal transaction through the ordinary lines.

The test circuit of this variant embodiment accomplishes the same performance as the preceding first variant embodiment, while being brought to the test mode or normal operation mode by the selective cutting of the fuses 20a-20c.

Figure 20:
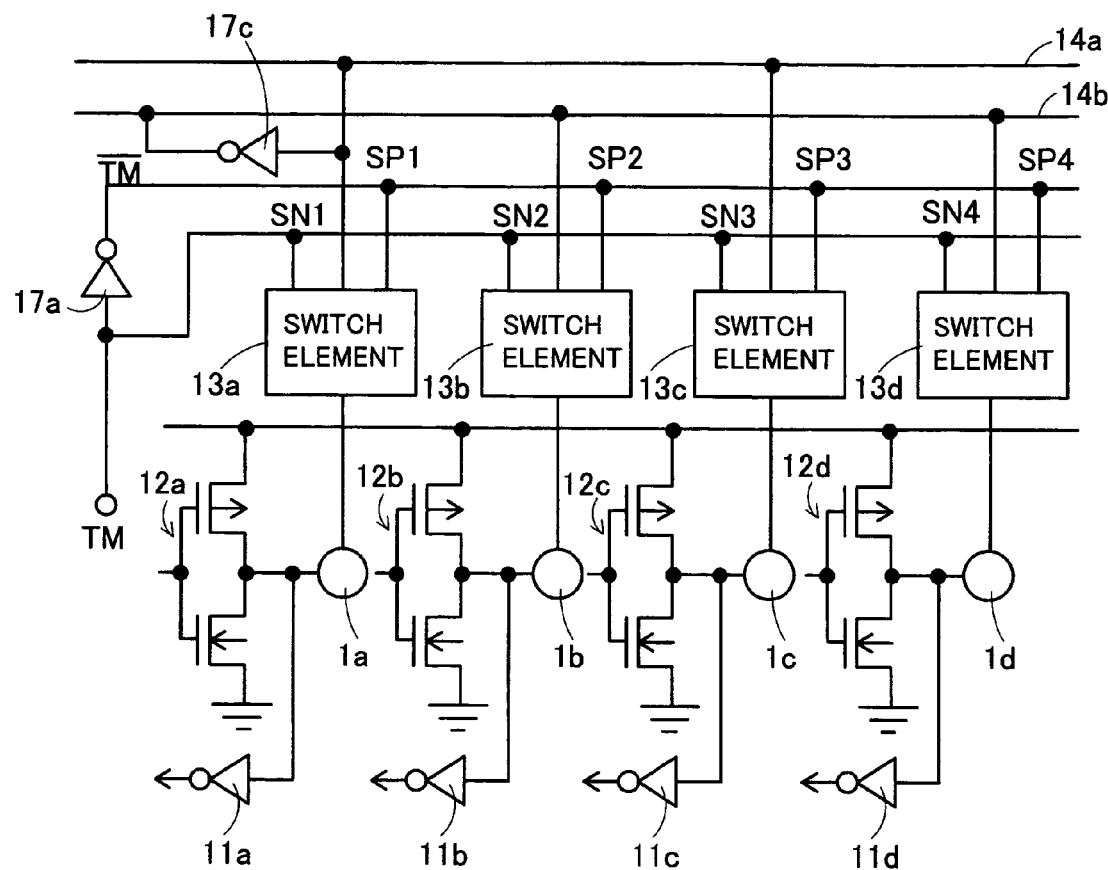
FIG. 20 is a schematic circuit diagram of a fifth variant of the fifth embodiment.

FIG. 20 shows the fifth variant embodiment. The test circuit of this variant embodiment includes an inverter 17c as voltage setting means having its input terminal connected to a testing line 14a and its output terminal connected to another testing line 14b. The remaining circuit arrangement is the same as the first variant embodiment.

Based on this circuit arrangement, in which the testing line 14b is always opposite in voltage level to the testing line 14a, it is enough to put a test signal in to the input/output pad 1a. In consequence, the number of input/output pads can be compressed more than the first variant embodiment for the operation test.

For the leak current test, the tester puts a test signal of the high level, for example, in to the input/output pad 1a, creating a voltage difference between the testing lines 14a and 14b.

In this state, a leak current arising between the adjacent input/output pads flows through the pad 1a into the test circuit. Accordingly, by sensing that leak current, the presence of a short-circuit between the adjacent pads can be detected.

When the tester puts a test signal of the low level in to the input/output pad 1a, a leak current arising between the adjacent pads flows from the test circuit through the pad 1a into the tester. Accordingly, by sensing that leak current, the presence of a short-circuit between the adjacent pads can be detected.

The test circuit of this variant embodiment accomplishes the same performance as the preceding first variant embodiment, while being capable of detecting the presence of a short-circuit between adjacent pads by putting a high or low-level test signal in to one input/output pad at the time of leak current test.

FIG. 21 shows the sixth variant embodiment. The testing line 14b is connected to the GND ground line through a switch element 13e (voltage setting means) similar to the switch elements 13a-13d. The switch element 13e is same in operation as the switch elements 13a-13d to turn on in response to a high-level switch control signal TM at the time of operation test.

At the time of operation test, the testing line 14b is brought to the low level of GND ground voltage and a test signal is put in to one of the input/output pads which are connected to the testing line 14a, and the pad is tested. In consequence, the number of pads to be made in contact with the tester probe can be compressed.

At the time of leak current test, a high-level signal is put in to one of the input/output pads which are connected to the testing line 14a, and the presence of a short-circuit between the adjacent pads can be detected.

FIG. 22 shows the seventh variant embodiment. The testing line 14b is connected to the VCC power line through a switch element 13f (voltage setting means). The switch element 13f is same in operation as the switch elements 13a-13d to turn on in response to a high-level switch control signal TM at the time of operation test.

At the time of operation test, the testing line 14b is brought to the high level of VCC power voltage and a test signal is put in to one of the input/output pads which are connected to the testing line 14a, and the pad is tested. In consequence, the number of pads to be made in contact with the tester probe can be compressed.

At the time of leak current test, a low-level signal is put in to one of the input/output pads which are connected to the testing line 14a, and the presence of a short-circuit between the adjacent pads can be detected.

The present invention is not confined to the foregoing embodiments, but various modifications and alterations are obviously possible without departing from the essence of the invention.

For example, the manners of conduction of switch elements explained in the foregoing embodiments can be combined arbitrarily among pads or among common pad groups.

Although in the foregoing embodiments the pad number compressive test has been exemplified by the leak current test and open-line test among DC tests, test items are not confined to these tests. The present invention can further be applied to the pure DC test represented by the leak current test which solely applies a DC bias voltage to the test pads and to the probing test which conducts measurement while imposing operational functions to the device under test represented by the open-line test.

The foregoing fifth embodiment can be altered as follows. First, a circuit arrangement for supplying a switch control signal to the test circuit among those of the first through fourth variants and a circuit arrangement for supplying a voltage level to the testing line among those of the fifth through seventh variants may be combined. Second, the first through seventh variants may be applied to adjacent input/output pads in other configuration than the linear pad alignment.

According to the inventive multi-bus semiconductor device and its probing test method, it becomes possible to perform DC tests including the pad leak current test and open-line test while dealing with an adequate number of devices for simultaneous measurement based on the scheme of pad number compressive test.

What is claim is:

1. A semiconductor device chip capable of testing, the semiconductor device chip comprising:
   switch elements which are turned on by a switch control signal which becomes active at the time of testing; and
   common testing lines, each of which is connected to either input pads or output pads through the switch elements, wherein every other input/output pad among the input/output pads in linear alignment is connected to different common testing lines than the other of the every other input/output pads, and when one of the input pads or the output pads connected to each common testing line is connected to a different tester probe, different biases are applied between adjacent input/output pads and a number of input/output pads is compressed at the time of testing.

2. A semiconductor device chip capable of testing, the semiconductor device chip comprising:
   switch elements which are turned on by a switch control signal which becomes active at the time of testing; and
   common testing lines, each of which is connected to either input pads or output pads through the switch elements, wherein each of the common testing lines is connected to one or more input/output pad and adjacent input/output pads are connected to different common testing lines, and when one of the input pads or the output pads connected to each common testing line is connected to a different tester probe, different biases are applied between adjacent input/output pads and a number of input/output pads is compressed at the time of testing.

3. A semiconductor device chip according to claim 2, wherein each of the switch elements is formed of a transfer gate which is made conductive in response to each of the switch control signals.

4. A semiconductor device chip according to claim 2, wherein the switch control signal is supplied from the internal circuit at time of testing.

5. A semiconductor device according to claim 2, wherein the switch control signal is supplied as a high-level signal through a switch control pad, the switch control pad being connected to the low-level power voltage through a resistor.

6. A semiconductor device according to claim 2, wherein the switch control signal is supplied as a low-level signal through a switch control pad, the switch control pad being connected to the high-level power voltage through a resistor.

7. A semiconductor device according to claim 2, wherein the switch control signal is generated by a switch control signal generation circuit.

8. A semiconductor device according to claim 7, wherein the switch control signal generation circuit generates the switch control signal based on the cutting of a fuse.

9. A semiconductor device according to claim 2, wherein each of the common testing lines has voltage setting unit.

10. A semiconductor device according to claim 9, wherein the voltage setting unit comprises a logic inverter which connects a pair of the common testing lines.

11. A semiconductor device according to claim 9, wherein the voltage setting unit comprises a switch element which connects one of a pair of the common testing lines to the low-level power voltage in response to the switch control signal.

12. A semiconductor device according to claim 9, wherein the voltage setting unit comprises a switch element which connects one of a pair of the common testing lines to the high-level power voltage in response to the switch control signal.

13. A semiconductor device wafer in which a plurality of semiconductor device chips are arranged, the semiconductor device chip comprising:
    switch elements which are turned on by a switch control signal which becomes active at the time of testing; and
    common testing lines, each of which is connected to either input pads or output pads through the switch elements, wherein each of the common testing lines is connected to one or more input/output pad and adjacent input/output pads are connected to different common testing lines, and when one of the input pads or the output pads connected to each common testing line is connected to a different tester probe, different biases are applied between adjacent input/output pads and a number of input/out pads is compressed at the time of testing.

14. A semiconductor device wafer in which a plurality of semiconductor device chips are arranged, the semiconductor device chip comprising:
    switch elements which are turned on by a switch control signal which becomes active at the time of testing; and
    common testing lines each of which is connected to either input pads or output pads through the switch elements, wherein every other input/output pad among the input/output pads in linear alignment is connected to different common testing lines than the other of the every other input/output pads, and when one of the input pads or the output pads connected to each common testing line is connected to a different tester probe, different biases are applied between adjacent input/output pads and a number of input/output pads is compressed at the time of testing.

* * * * *